US012087626B2

(12) United States Patent
Amano et al.

(10) Patent No.: US 12,087,626 B2
(45) Date of Patent: Sep. 10, 2024

(54) HIGH ASPECT RATIO VIA FILL PROCESS EMPLOYING SELECTIVE METAL DEPOSITION AND STRUCTURES FORMED BY THE SAME

(71) Applicant: SANDISK TECHNOLOGIES LLC, Addison, TX (US)

(72) Inventors: Fumitaka Amano, Yokkaichi (JP); Kensuke Ishikawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 459 days.

(21) Appl. No.: 17/509,323

(22) Filed: Oct. 25, 2021

(65) Prior Publication Data

US 2023/0128326 A1 Apr. 27, 2023

(51) Int. Cl.
*H01L 21/768* (2006.01)
*H01L 23/532* (2006.01)

(52) U.S. Cl.
CPC .. *H01L 21/76877* (2013.01); *H01L 21/76802* (2013.01); *H01L 23/53238* (2013.01)

(58) Field of Classification Search
CPC ......... H01L 21/76877; H01L 21/76802; H01L 23/53238; H01L 21/76807; H01L 21/76843; H01L 21/76849; H01L 29/40117; H01L 21/76879; H01L 21/28562; H10B 43/10; H10B 43/50; H10B 43/27
See application file for complete search history.

(56) References Cited

U.S. PATENT DOCUMENTS

| 9,484,296 | B2 | 11/2016 | Takahashi et al. |
| 9,515,085 | B2 | 12/2016 | Rabkin et al. |
| 9,613,975 | B2 | 4/2017 | Huang et al. |
| 10,115,459 | B1 | 10/2018 | Yamada et al. |
| 10,192,878 | B1 | 1/2019 | Tsutsumi et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Karen Kusumakar
(74) *Attorney, Agent, or Firm* — THE MARBURY LAW GROUP PLLC

(57) ABSTRACT

A method includes forming a semiconductor device, forming a combination of a connection-level dielectric layer and a connection-level metal interconnect structure over the semiconductor device, forming a line-and-via-level dielectric layer over the connection-level dielectric layer, forming an integrated line-and-via cavity through the line-and-via-level dielectric layer over the connection-level metal interconnect structure, selectively growing a conductive via structure consisting essentially of an elemental metal that is not copper from a physically exposed conductive surface located at a bottom of the via portion of the integrated line-and-via cavity without filling a line portion of the integrated line-and-via cavity, and forming a copper-based conductive line structure that includes copper at an atomic percentage that is greater than 90% in the line portion of the integrated line-and-via cavity.

19 Claims, 44 Drawing Sheets

(56) References Cited

U.S. PATENT DOCUMENTS

| | | | |
|---|---|---|---|
| 10,707,228 | B2 | 7/2020 | Yu et al. |
| 2008/0017989 | A1 | 1/2008 | Lee et al. |
| 2008/0308942 | A1 | 12/2008 | Chanda et al. |
| 2009/0102052 | A1 | 4/2009 | Ryu |
| 2009/0298281 | A1 | 12/2009 | Yang et al. |
| 2010/0078818 | A1 | 4/2010 | Ishizaka et al. |
| 2015/0091181 | A1 | 4/2015 | Li et al. |
| 2016/0293621 | A1 | 10/2016 | Huang et al. |
| 2017/0271347 | A1 | 9/2017 | Fukuzumi |
| 2017/0316970 | A1 | 11/2017 | Clevenger et al. |
| 2018/0182668 | A1 | 6/2018 | Xie et al. |
| 2018/0261557 | A1 | 9/2018 | Yu et al. |
| 2019/0312035 | A1 | 10/2019 | Takuma et al. |
| 2019/0341360 | A1 | 11/2019 | Yu et al. |
| 2020/0006131 | A1 | 1/2020 | Shimabukuro et al. |
| 2020/0013671 | A1 | 1/2020 | Clevenger et al. |
| 2020/0066745 | A1 | 2/2020 | Yu et al. |
| 2020/0350494 | A1 | 11/2020 | Dutta et al. |
| 2020/0395299 | A1 | 12/2020 | Lee et al. |
| 2021/0028149 | A1 | 1/2021 | Makala et al. |
| 2021/0043643 | A1* | 2/2021 | Lu .................... H01L 21/76895 |
| 2021/0090942 | A1 | 3/2021 | Yang et al. |
| 2021/0193585 | A1 | 6/2021 | Said et al. |
| 2021/0242237 | A1 | 8/2021 | Lim et al. |
| 2022/0344205 | A1* | 10/2022 | Iwashita ............. C23C 18/1879 |
| 2022/0415818 | A1* | 12/2022 | Naylor .............. H01L 21/76883 |
| 2023/0094757 | A1* | 3/2023 | Clevenger ........... H01L 21/7681 |
| | | | 438/572 |

OTHER PUBLICATIONS

U.S. Appl. No. 16/984,700, filed Aug. 4, 2020, SanDisk Technologies LLC.
U.S. Appl. No. 17/000,934, filed Aug. 24, 2020, SanDisk Technologies LLC.
U.S. Appl. No. 17/094,543, filed Nov. 10, 2020, SanDisk Technologies LLC.
U.S. Appl. No. 17/153,972, filed Jan. 21, 2021, SanDisk Technologies LLC.
U.S. Appl. No. 17/208,019, filed Mar. 22, 2021, SanDisk Technologies LLC.
U.S. Appl. No. 17/345,315, filed Jun. 11, 2021, SanDisk Technologies LLC.
U.S. Appl. No. 17/479,573, filed Sep. 20, 2021, SanDisk Technologies LLC.
U.S. Appl. No. 17/479,637, filed Sep. 20, 2021, SanDisk Technologies LLC.
Clark, R. et al., "Perspective: New Process Technologies Required for Future Devices and Scaling," APL Materials, vol. 6, 058203 (2018); doi: 10.1063/1.5026805, 14 pages.
Yunogami, T., "The Trend in the Semiconductor Industry is Clearly "Three-Dimensional" VLAI 2019 (2.4)," EE Times, Japan, Semiconductor Devices, 5 pages, retrieved from: https://eetimes.jp/ee/articles/1906/20/news037_2.html, visit Jan. 22, 2021.
ISR—Notification of Transmittal of The International Search Report and Written Opinion of the International Searching Authority for International Patent Application No. PCT/US2022/029316, mailed Apr. 25, 2023, 12 pages.

* cited by examiner

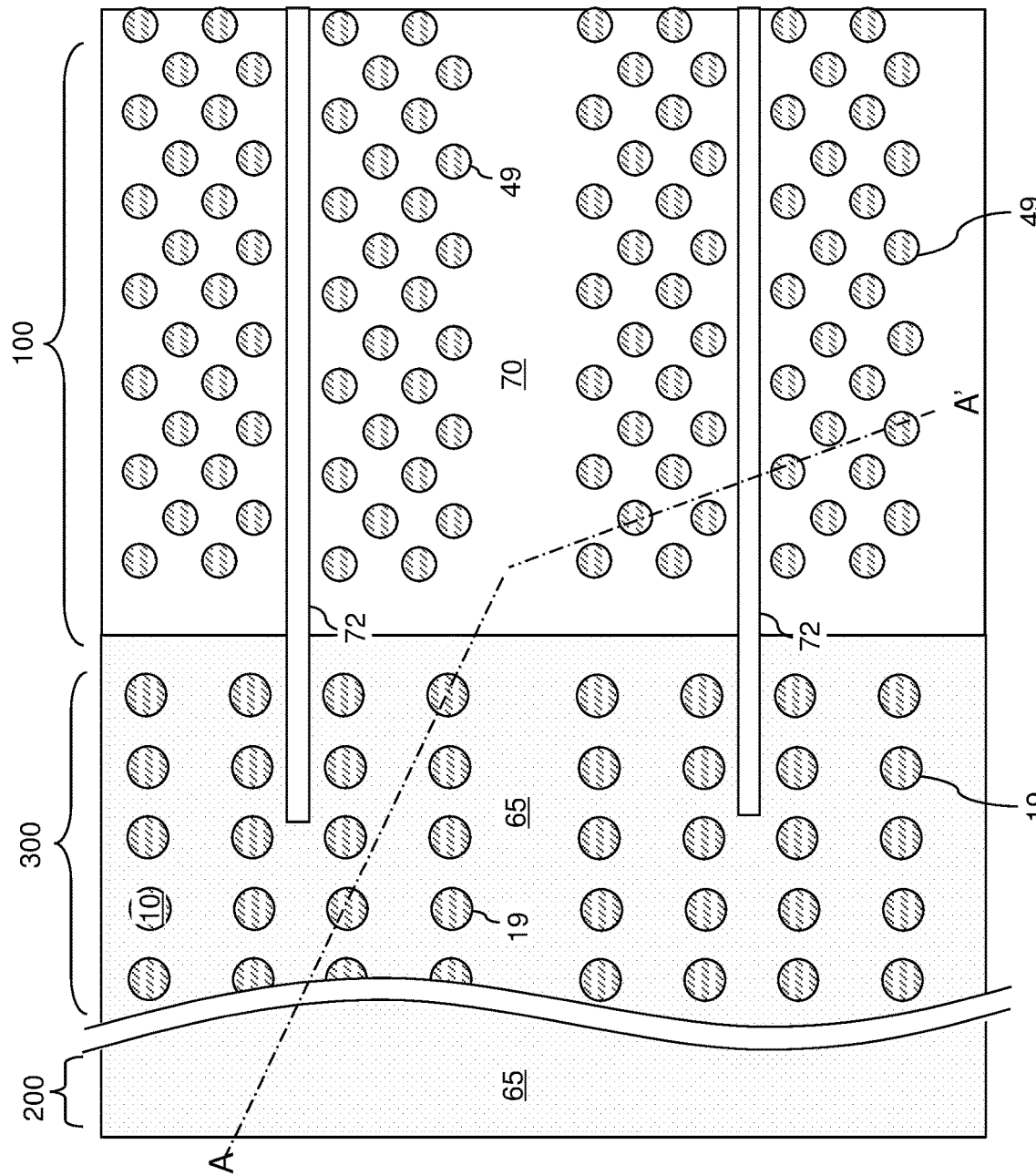

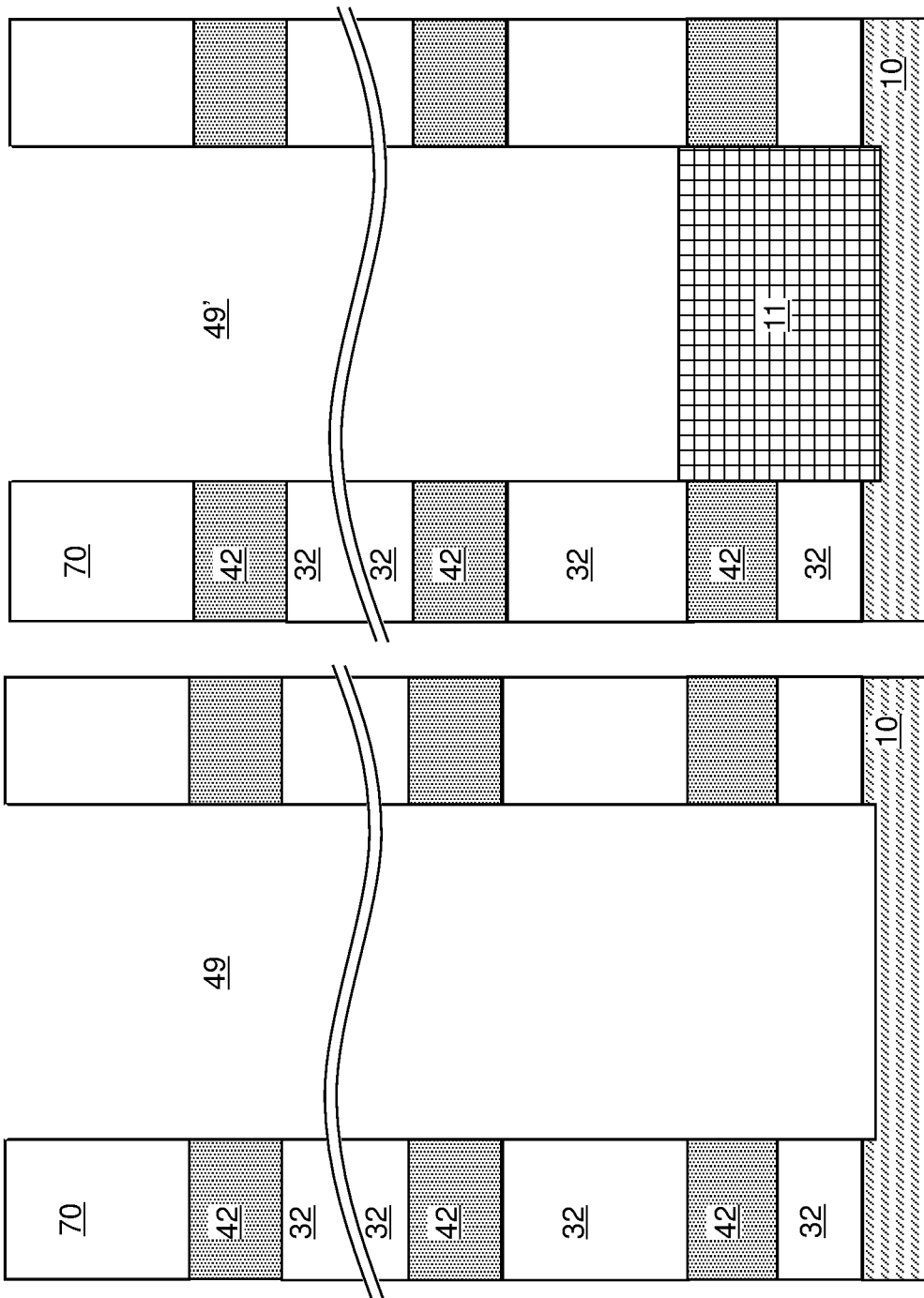

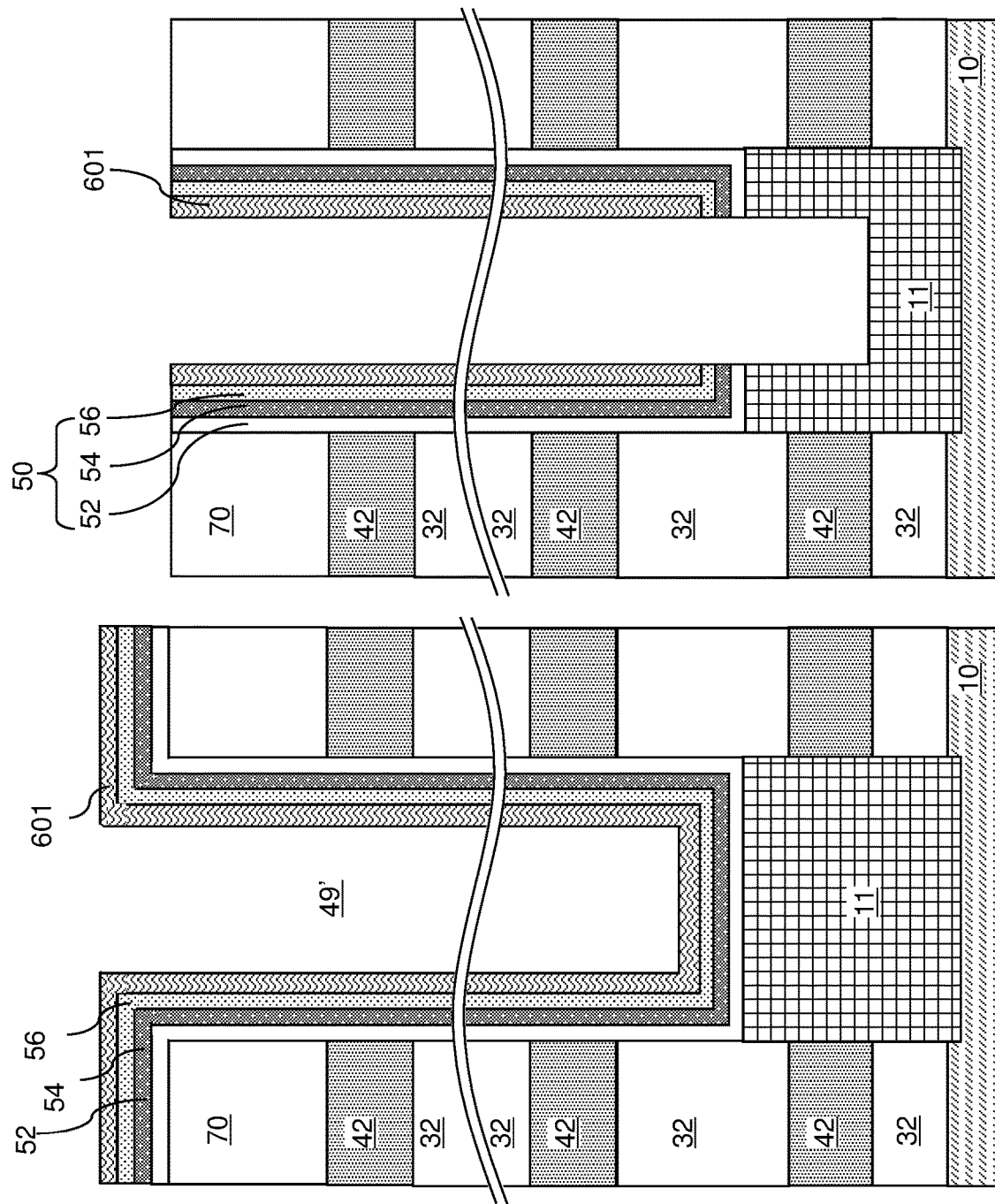

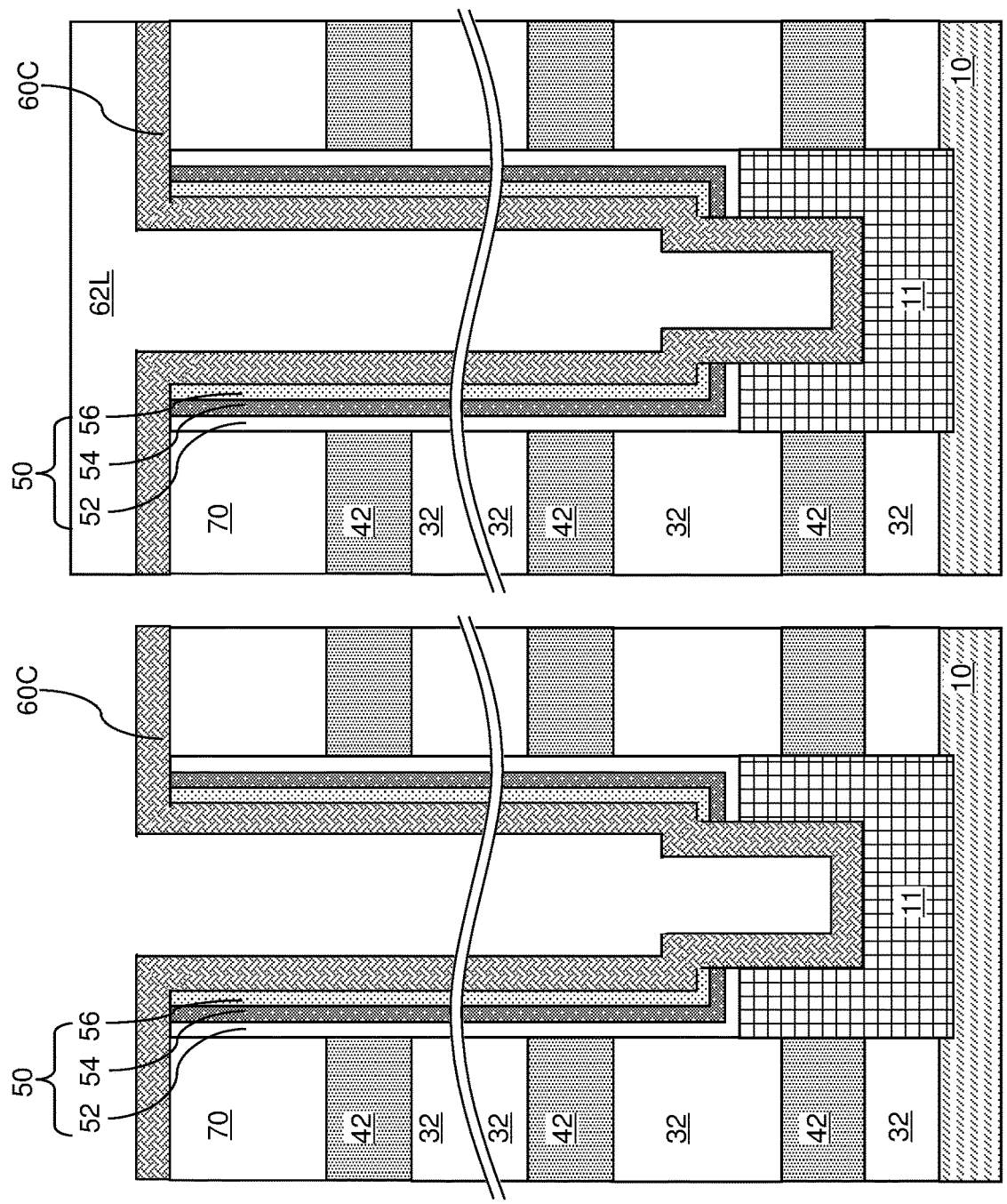

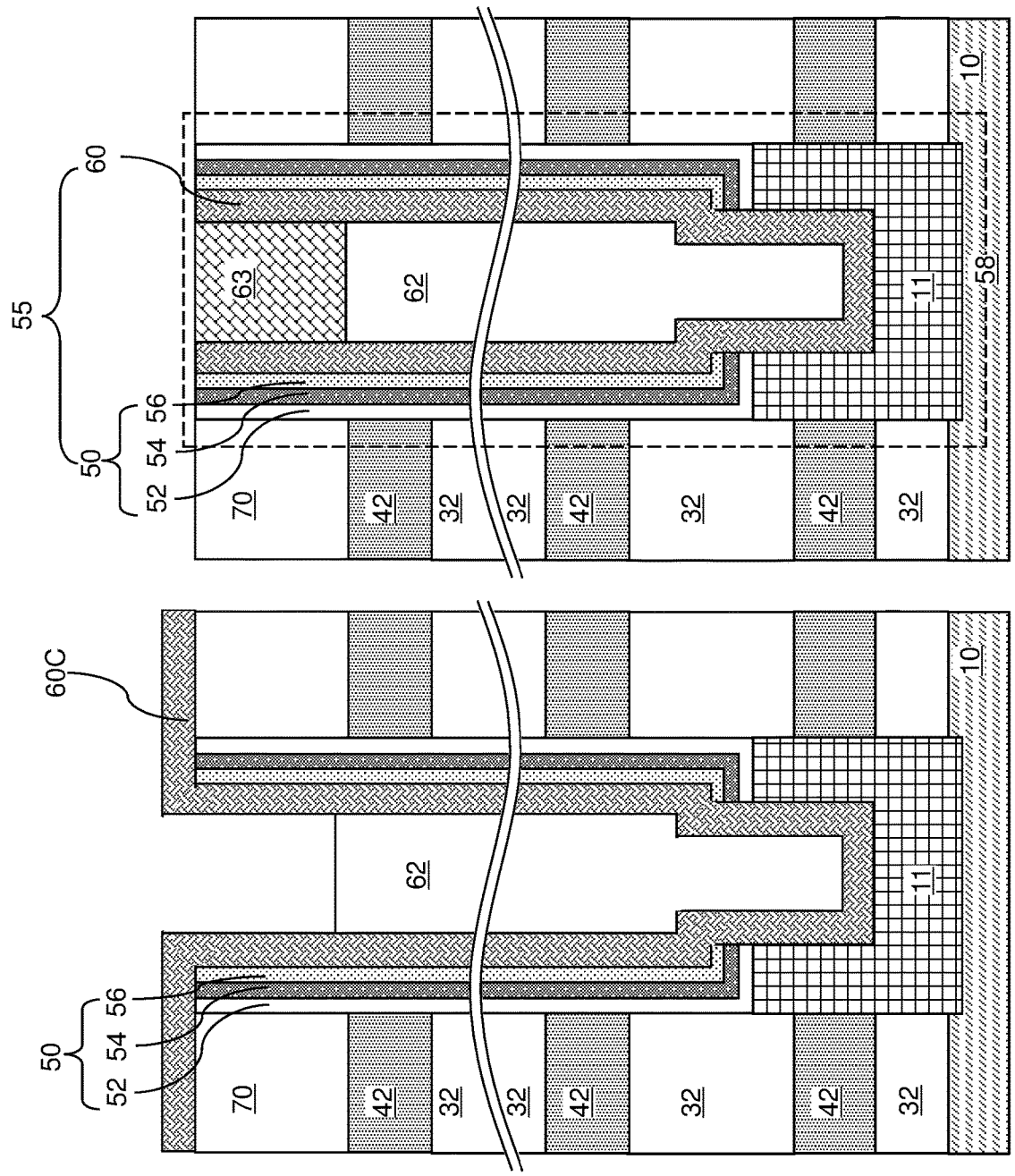

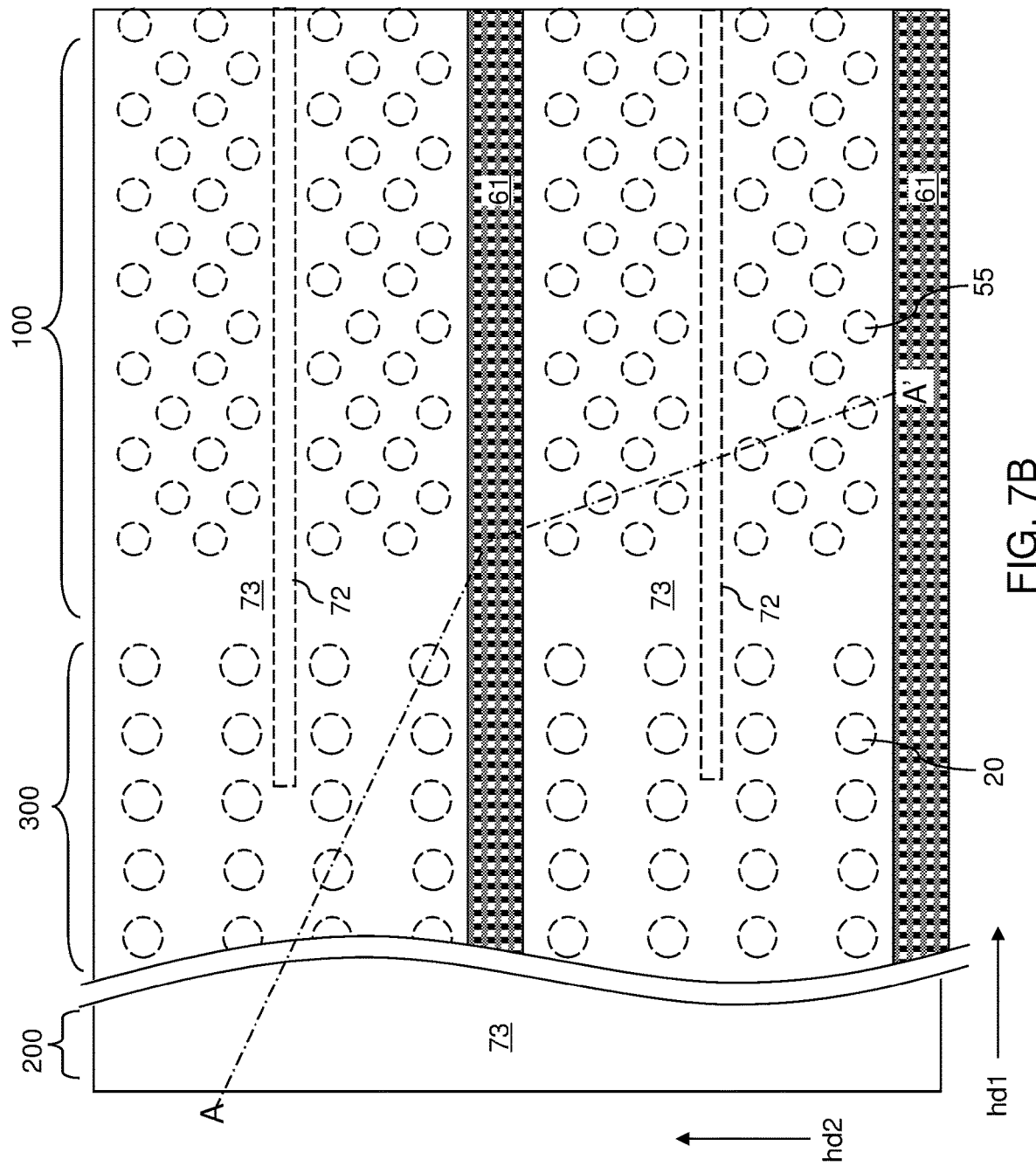

HIGH ASPECT RATIO VIA FILL PROCESS EMPLOYING SELECTIVE METAL DEPOSITION AND STRUCTURES FORMED BY THE SAME

FIELD

The present disclosure relates generally to the field of semiconductor devices, and particularly to a high aspect ratio via fill process employing selective metal deposition and structures formed by the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method includes forming a semiconductor device, forming a combination of a connection-level dielectric layer and a connection-level metal interconnect structure over the semiconductor device, forming a line-and-via-level dielectric layer over the connection-level dielectric layer, forming an integrated line-and-via cavity through the line-and-via-level dielectric layer over the connection-level metal interconnect structure, selectively growing a conductive via structure consisting essentially of an elemental metal that is not copper from a physically exposed conductive surface located at a bottom of the via portion of the integrated line-and-via cavity without filling a line portion of the integrated line-and-via cavity, and forming a copper-based conductive line structure that comprises copper at an atomic percentage that is greater than 90% in the line portion of the integrated line-and-via cavity.

According to another aspect of the present disclosure, a semiconductor structure includes a semiconductor device located over a substrate, a connection-level metal interconnect structure electrically connected to a node of the semiconductor device and embedded in a connection-level dielectric layer, and an interconnect line-and-via structure embedded in a line-and-via-level dielectric layer that overlies the connection-level dielectric layer. The interconnect line-and-via structure comprises a conductive via structure that overlies and is electrically connected to the connection-level metal interconnect structure and consists essentially of an elemental metal that is not copper, and a copper-based conductive line structure that comprises copper at an atomic percentage that is greater than 90%, overlies the conductive via structure, and has a greater lateral extent than the conductive via structure.

BRIEF DESCRIPTION OF THE DRAWINGS

FIG. 4B is a top-down view of the first exemplary structure of FIG. 4A. The vertical plane A-A' is the plane of the cross-section for FIG. 4A.

FIGS. 5A-5H are sequential schematic vertical cross-sectional views of a memory opening within the first exemplary structure during formation of a memory stack structure, an optional dielectric core, and a drain region therein according to an embodiment of the present disclosure.

FIG. 7B is a partial see-through top-down view of the first exemplary structure of FIG. 7A. The vertical plane A-A' is the plane of the schematic vertical cross-sectional view of FIG. 7A.

DETAILED DESCRIPTION

Figure 1:
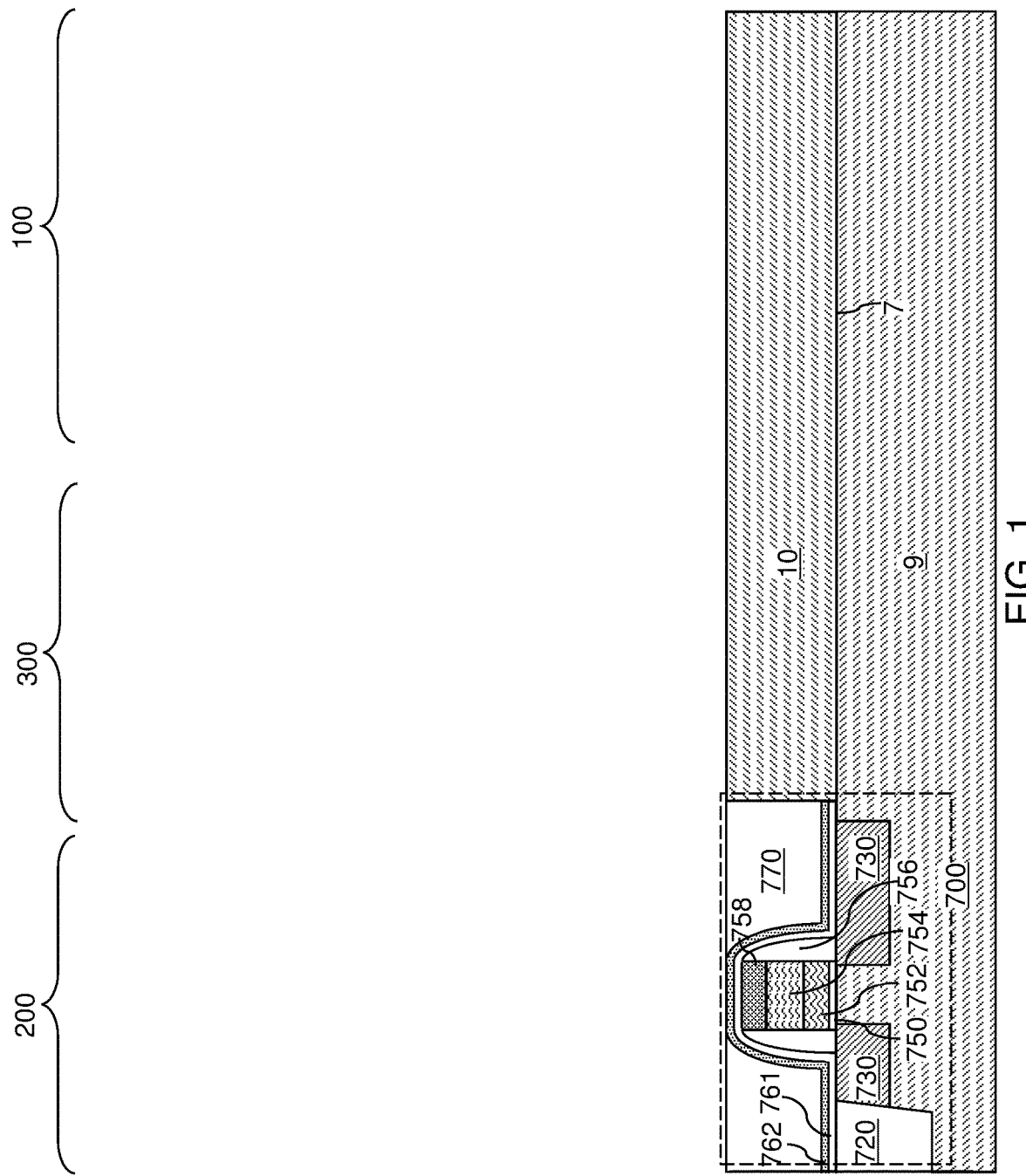
FIG. 1 is a schematic vertical cross-sectional view of a first exemplary structure after formation of at least one peripheral device, a semiconductor material layer, and a gate dielectric layer according to an embodiment of the present disclosure.

As discussed above, the embodiments of the present disclosure are directed to high aspect ratio via fill process employing selective metal deposition, such as a process for forming bit lines of semiconductor devices, the various aspects of which are described below. The embodiments of the disclosure can be employed to form various semiconductor devices, non-limiting examples of which include three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
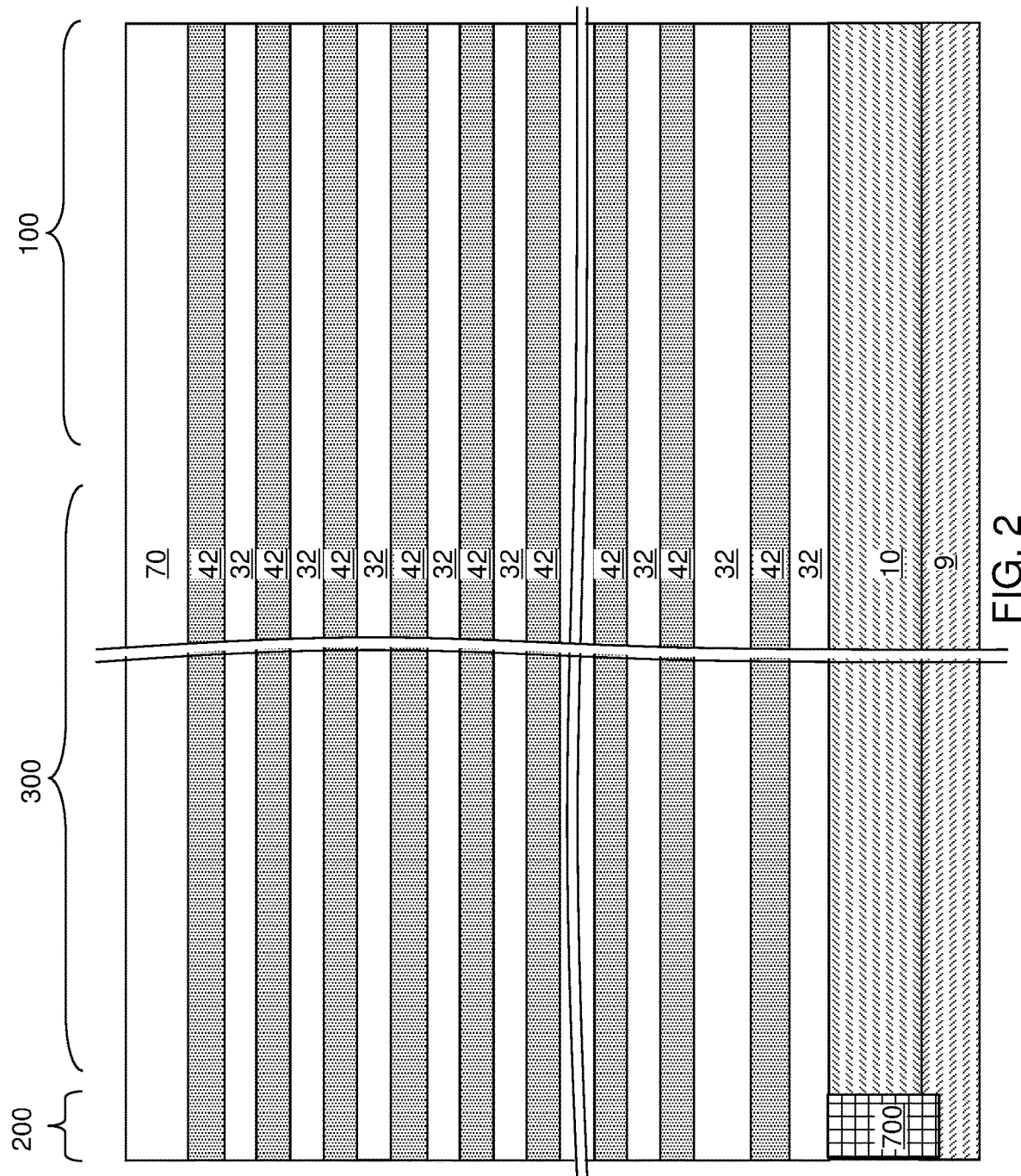
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
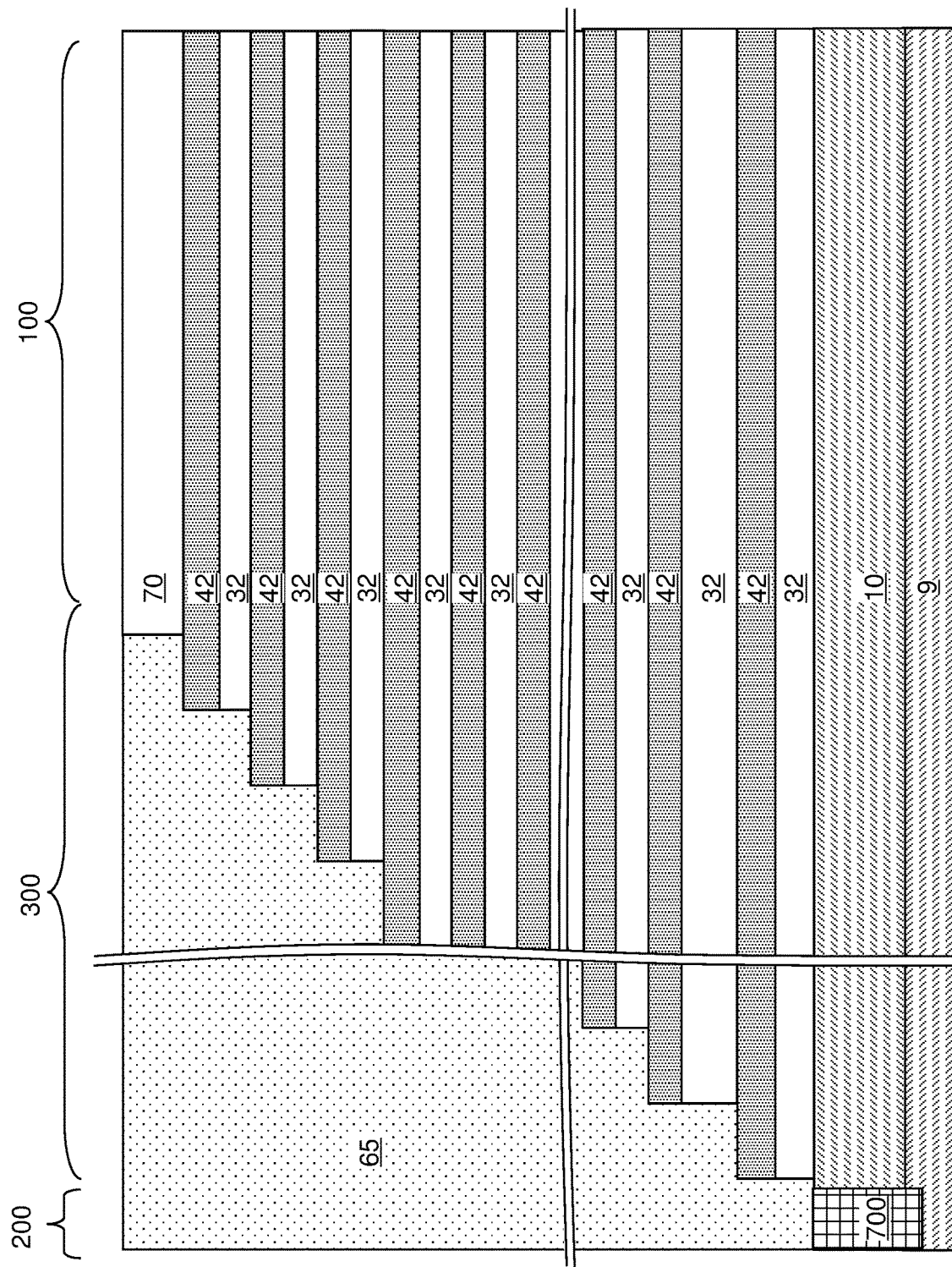
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
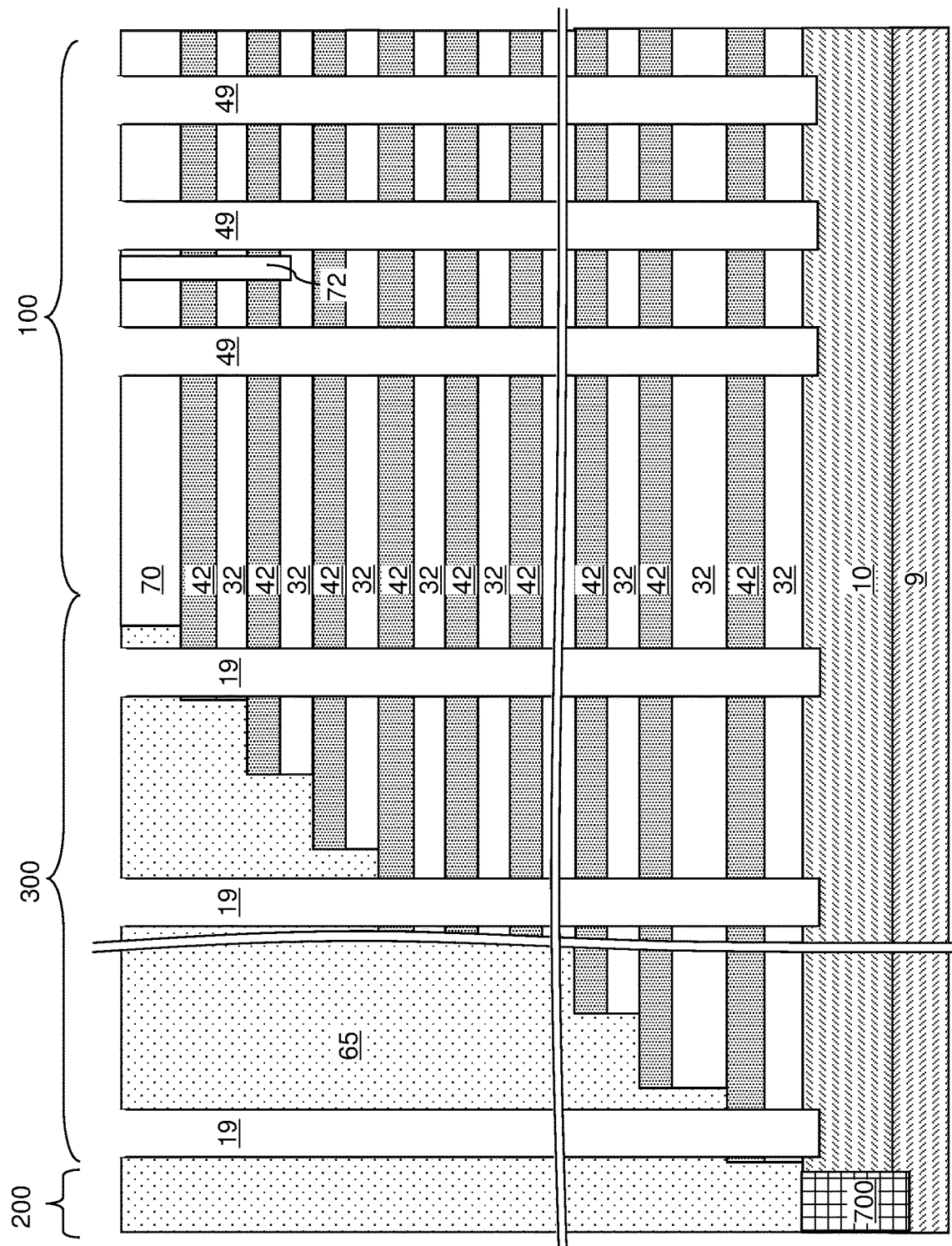
FIG. 4A is a schematic vertical cross-sectional view of the first exemplary structure after formation of memory openings and support openings according to an embodiment of the present disclosure.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a memory material layer 54, a dielectric material liner 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide (LaO$_2$), yttrium oxide (Y$_2$O$_3$), tantalum oxide (Ta$_2$O$_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

In one embodiment, the dielectric material liner 56 can include a gate dielectric material if the memory material layer 54 comprises a ferroelectric layer. In another embodiment, if the memory material layer 54 comprises a charge storage layer, then the dielectric material liner 56 may be a tunneling dielectric material including a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, the blocking dielectric layer 52 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Referring to FIG. 5F, in case the memory cavity 49' in each memory opening is not completely filled by the semiconductor channel layer 60C, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the dielectric material liner 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
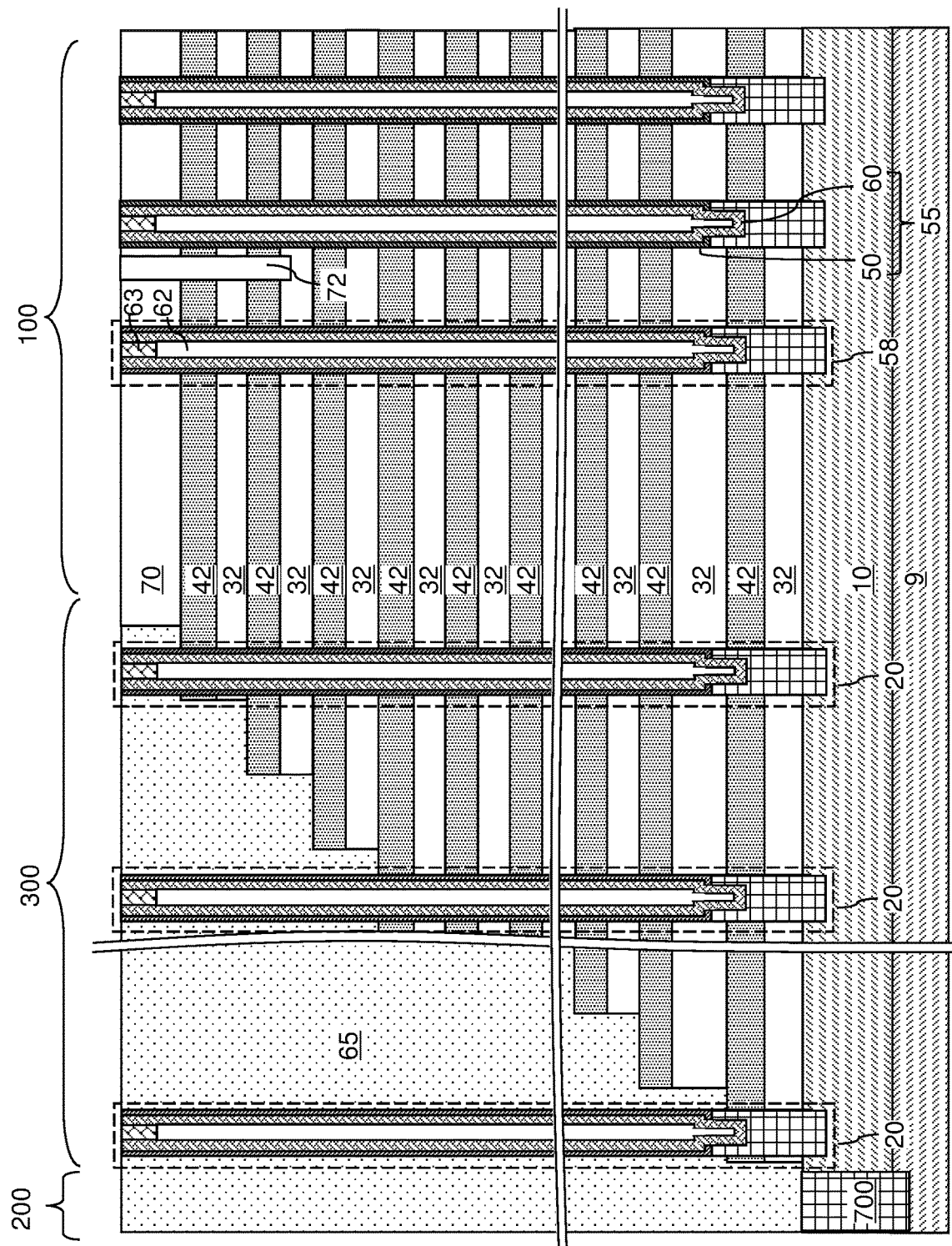
FIG. 6 is a schematic vertical cross-sectional view of the first exemplary structure after formation of memory stack structures and support pillar structures according to an embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60 and a vertical stack of charge storage regions or ferroelectric regions (comprising memory material layer 54) laterally surrounding the dielectric material liner 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
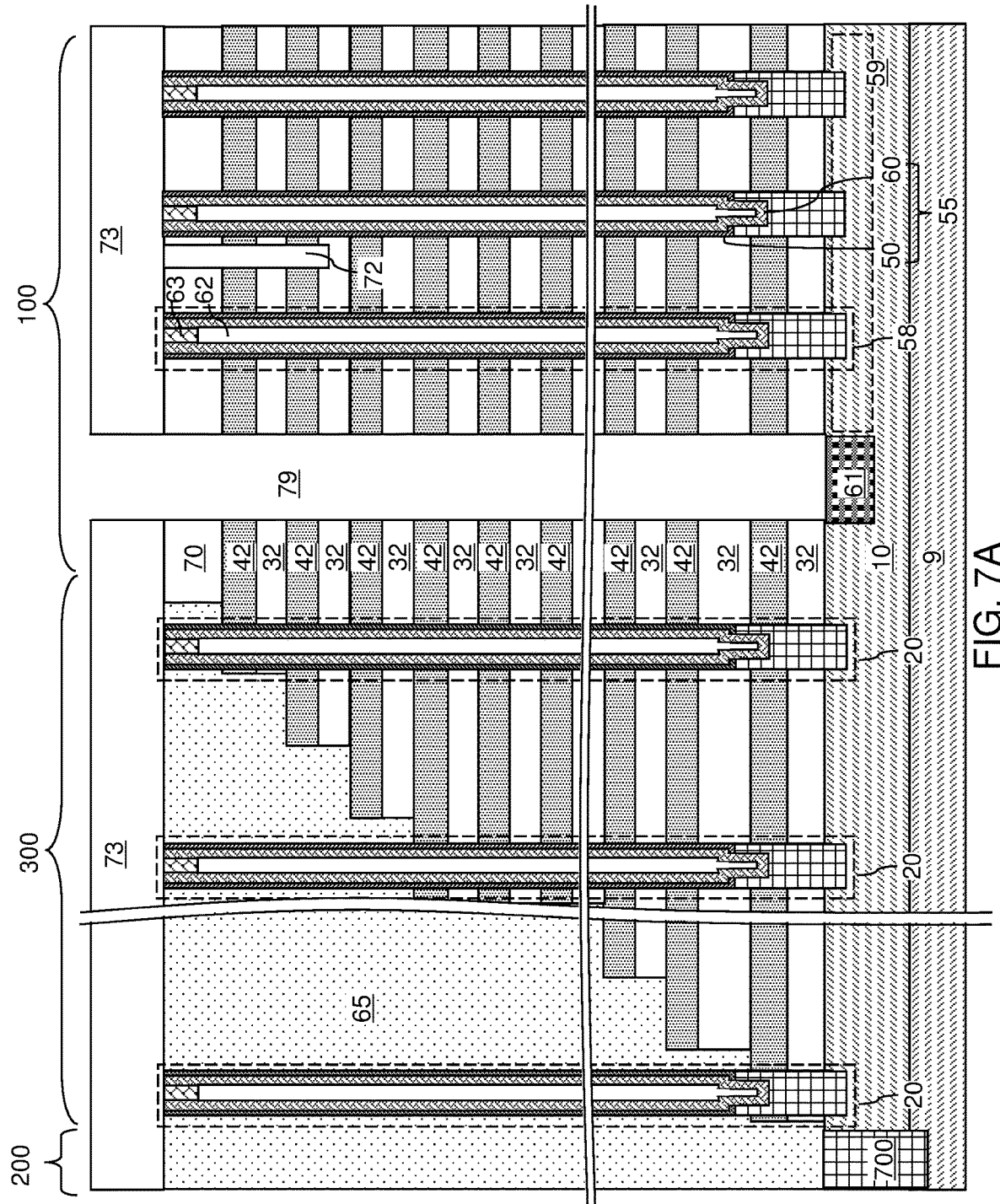
FIG. 7A is a schematic vertical cross-sectional view of the first exemplary structure after formation of backside trenches according to an embodiment of the present disclosure.
Figure 7C:
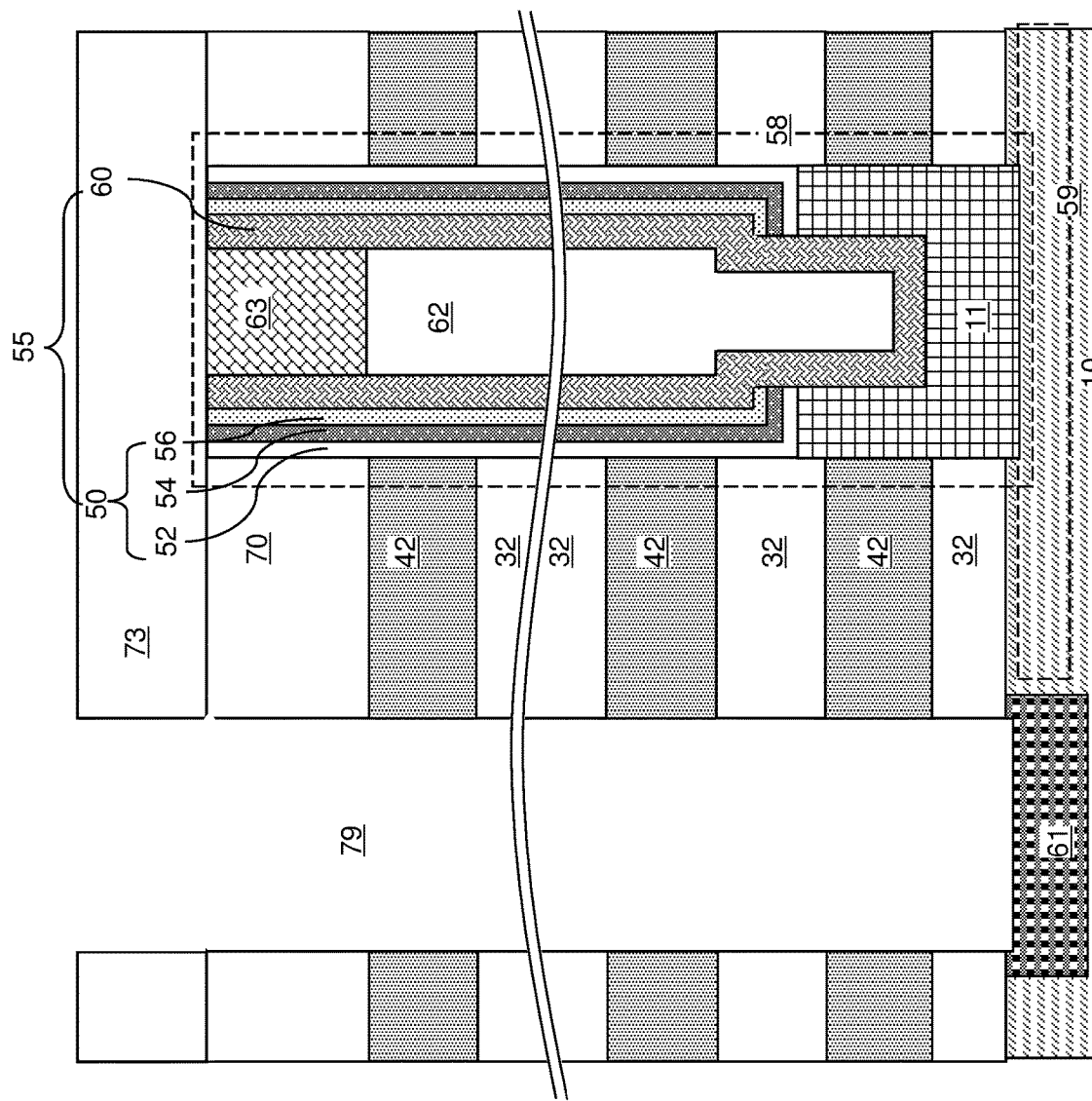
FIG. 7C is a magnified view of a region of the first exemplary structure of FIG. 7A.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8A:
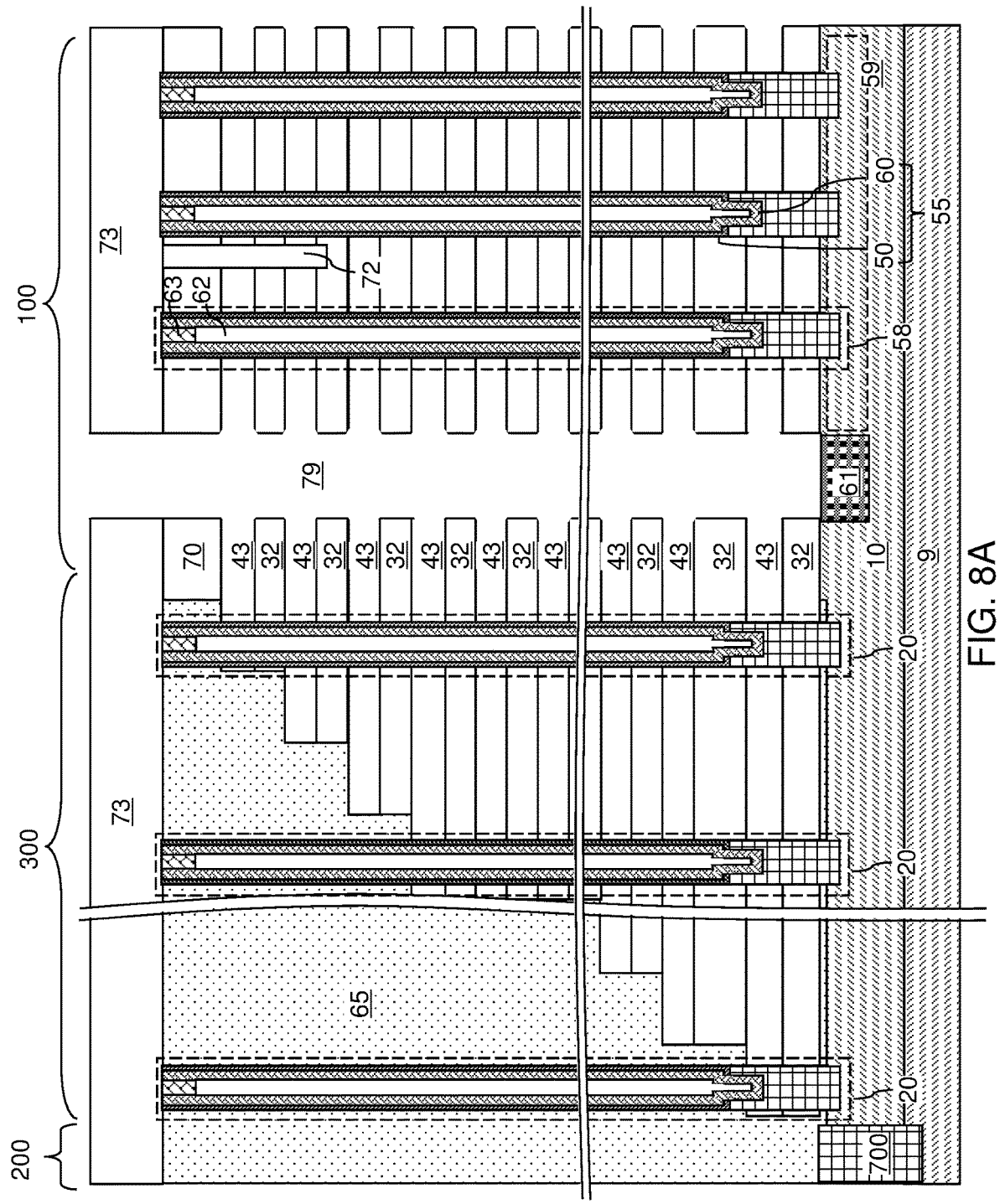
FIG. 8A is a schematic vertical cross-sectional view of the first exemplary structure after formation of backside recesses according to an embodiment of the present disclosure.
Figure 8B:
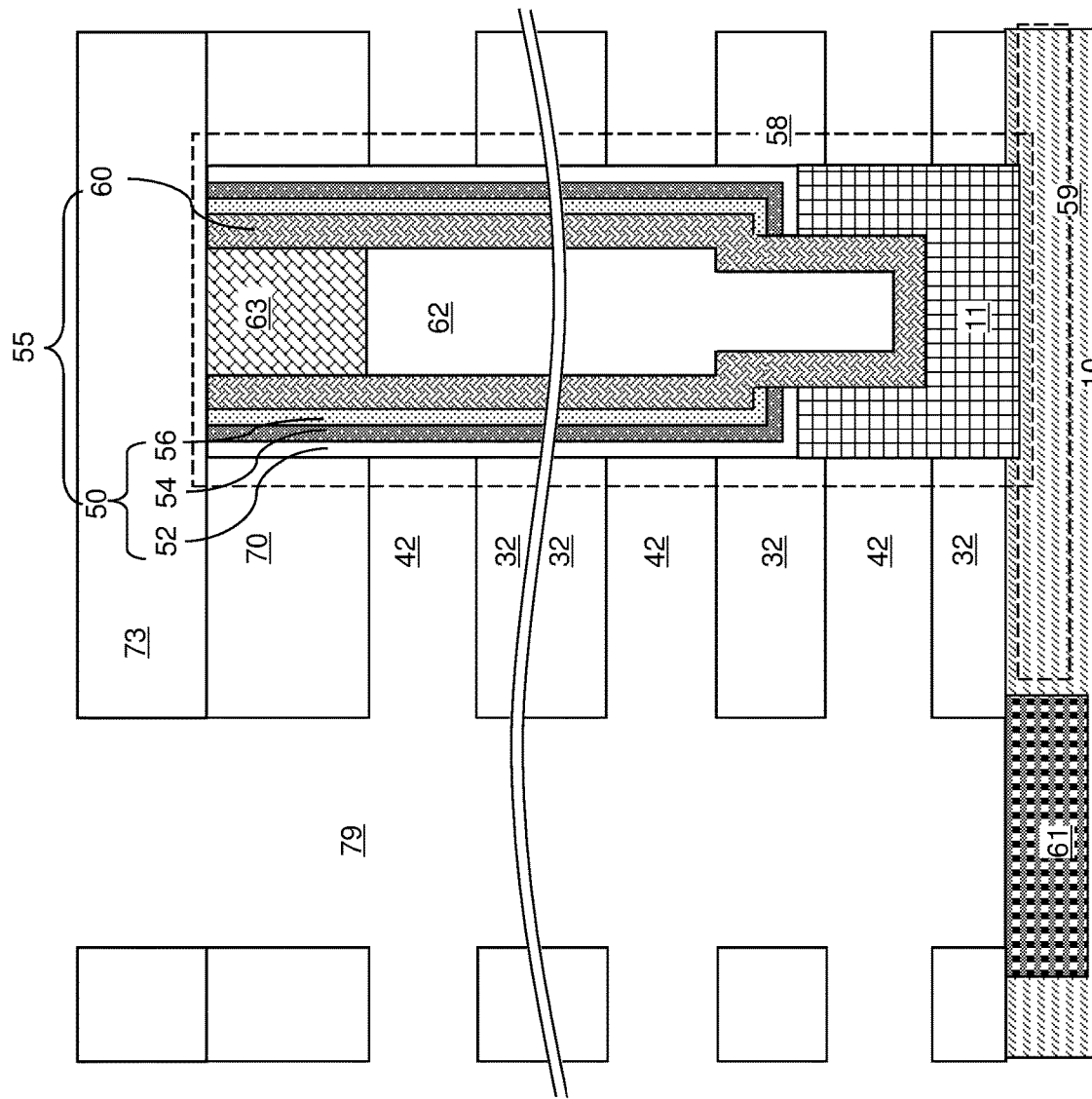
FIG. 8B is a magnified view of a region of the first exemplary structure of FIG. 8A.

Referring to FIGS. 8A and 8B, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Figure 9:
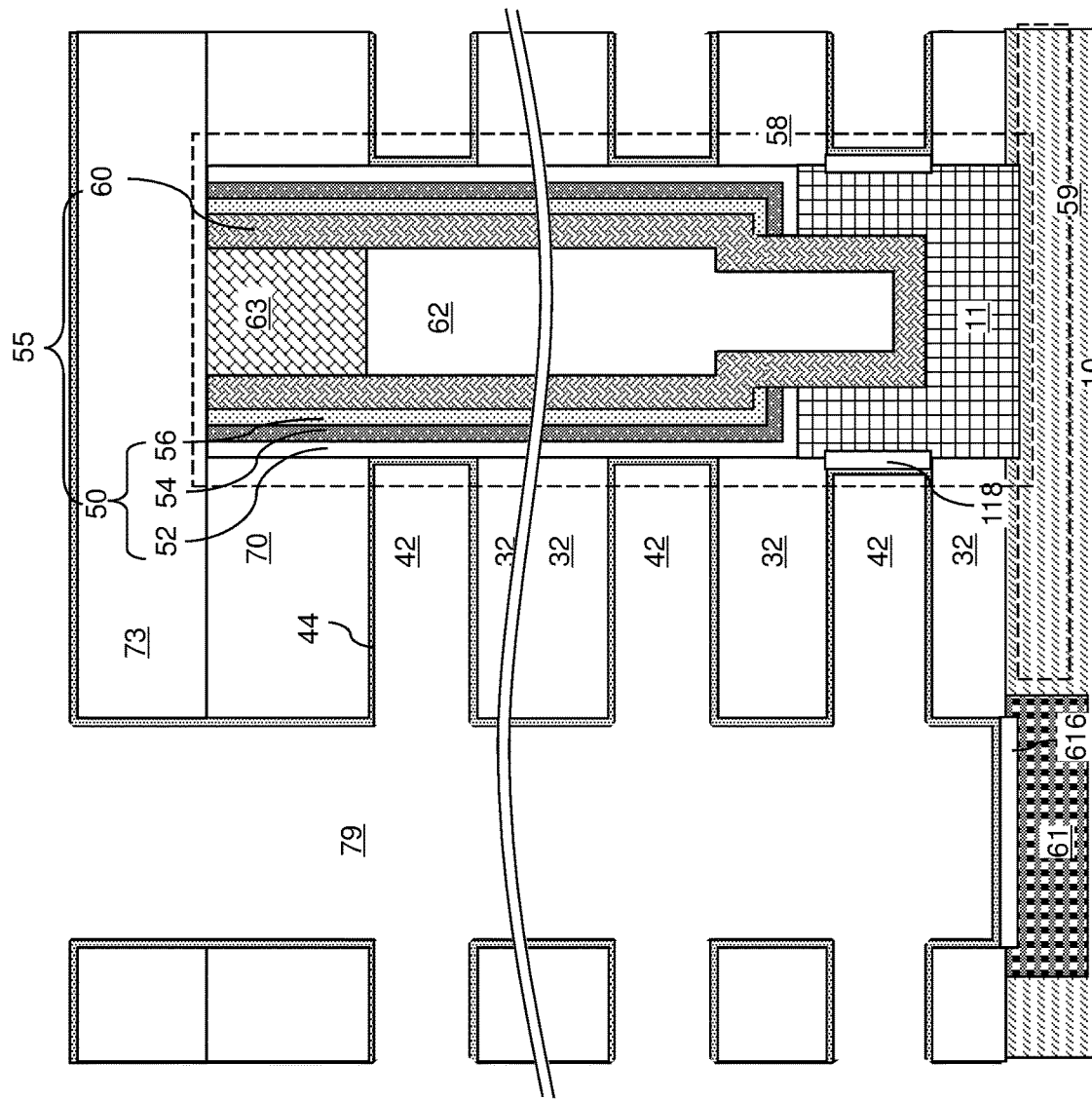
FIG. 9 is a schematic vertical cross-sectional view of a region of the first exemplary structure after formation of tubular dielectric spacers and a backside blocking dielectric layer according to an embodiment of the present disclosure.

Referring to FIG. 9, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

A backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 10:
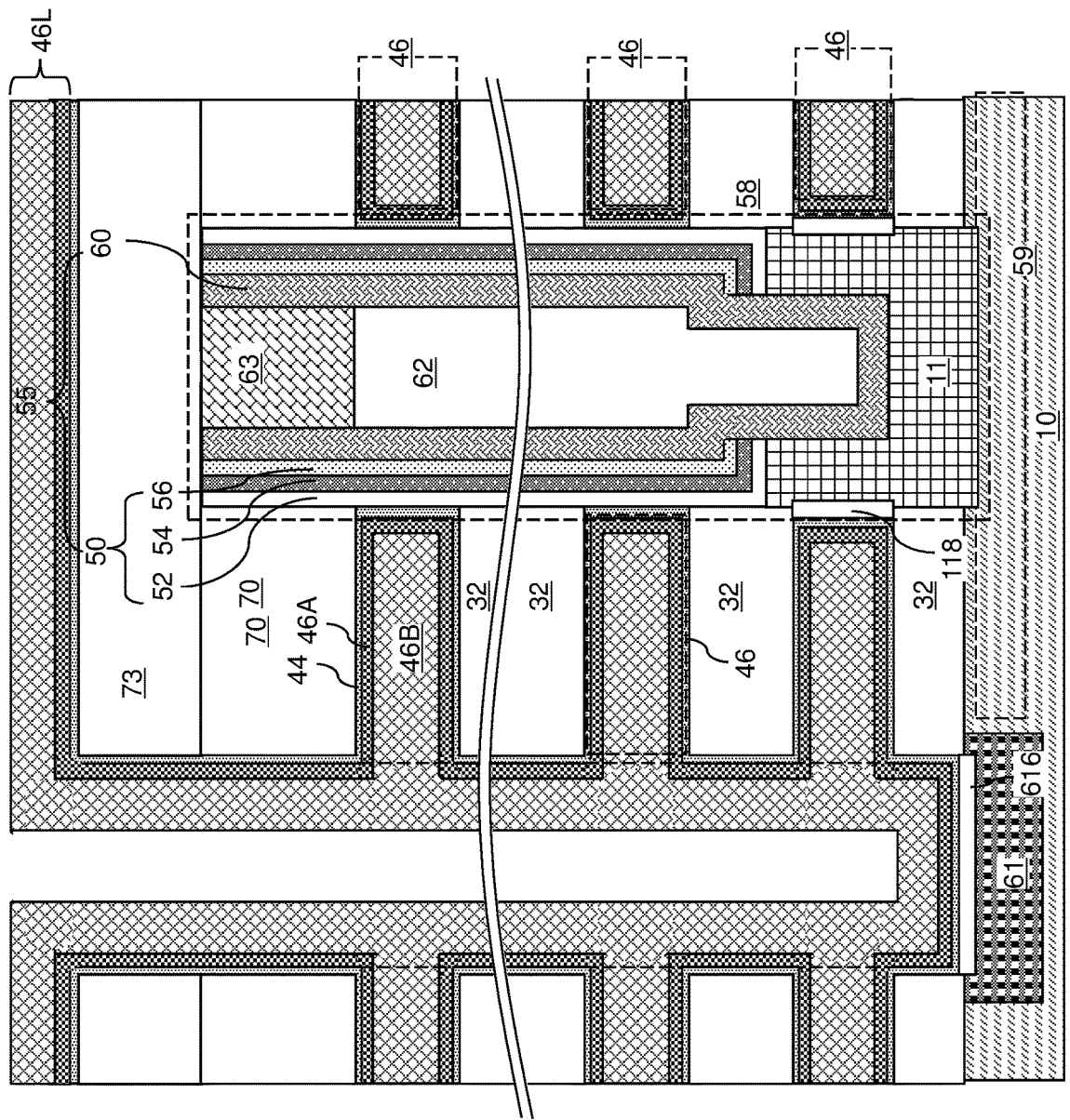
FIG. 10 is a schematic vertical cross-sectional view of a region of the first exemplary structure after deposition of at least one electrically conductive material according to an embodiment of the present disclosure.

Referring to FIG. 10, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
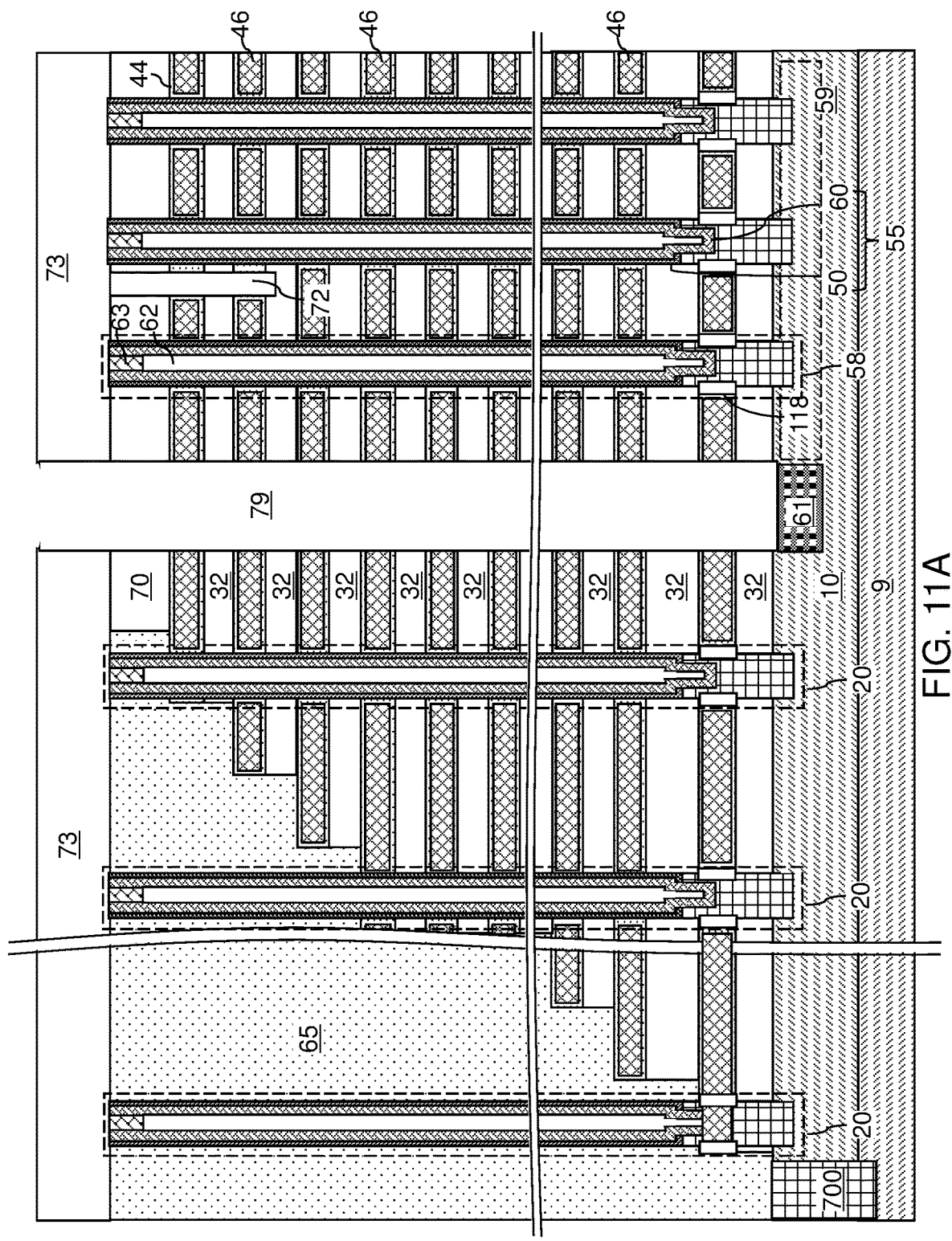
FIG. 11A is a schematic vertical cross-sectional view of the first exemplary structure after removal of the at least one electrically conductive material from inside the backside trenches and from above a contact-level dielectric layer according to an embodiment of the present disclosure.
Figure 11B:
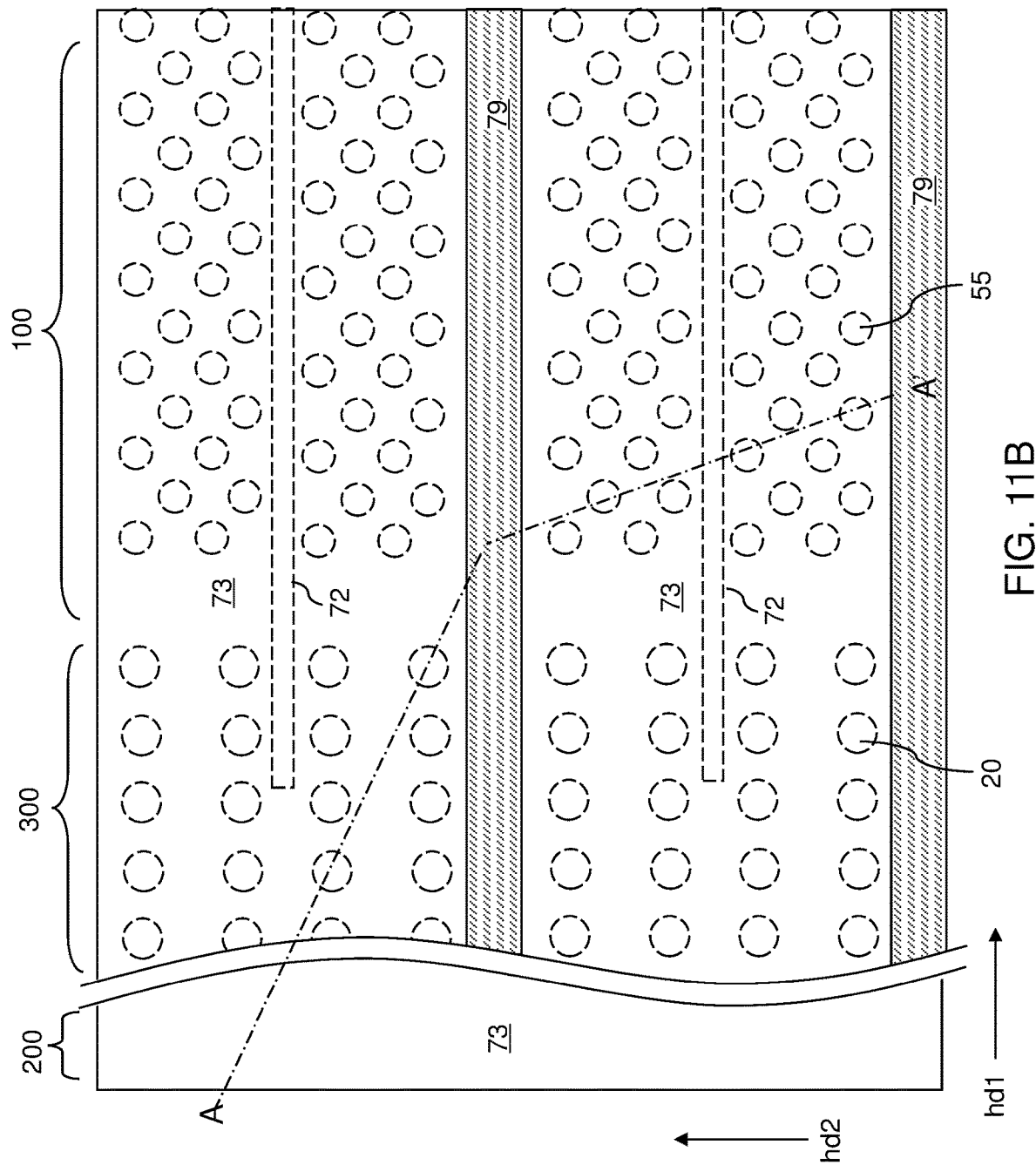
FIG. 11B is a partial see-through top-down view of the first exemplary structure of FIG. 11A. The vertical plane A-A' is the plane of the schematic vertical cross-sectional view of FIG. 11A.
Figure 11C:
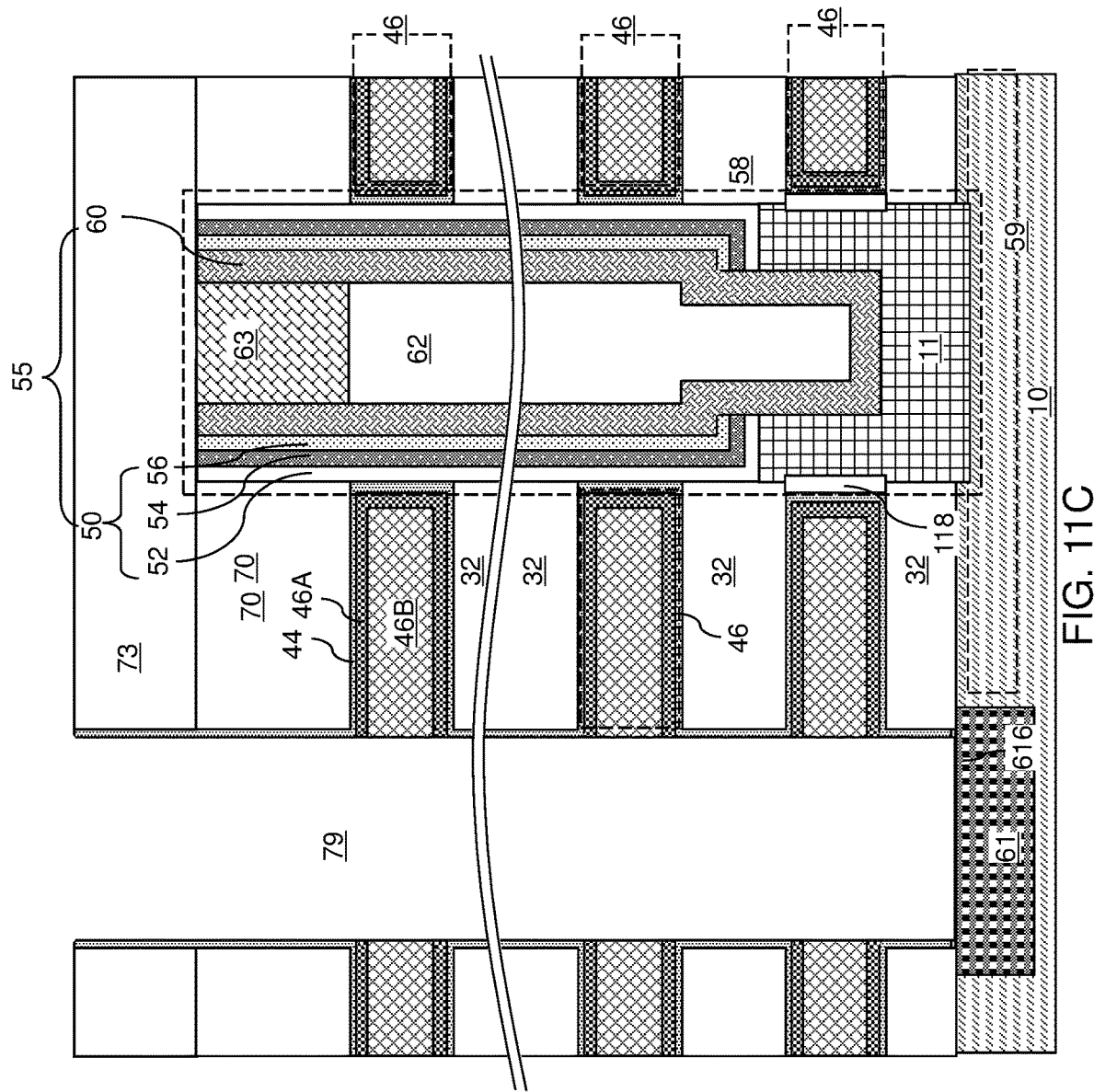
FIG. 11C is a magnified view of a region of the first exemplary structure of FIG. 11A.

Referring to FIGS. 11A-11C, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. Each backside cavity 79' continuous extends along the first horizontal direction hd1.

Figure 12:
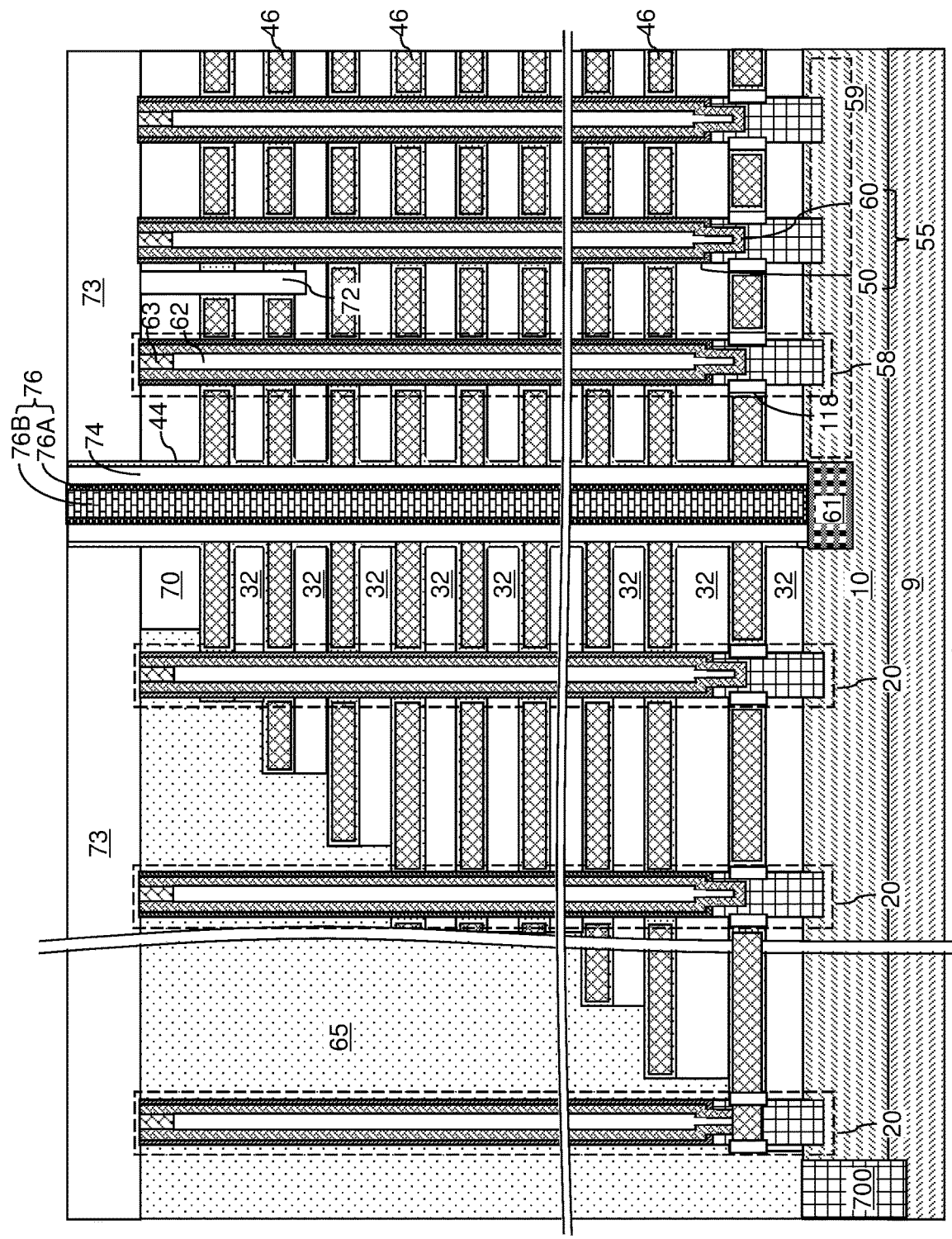
FIG. 12 is a schematic vertical cross-sectional view of the first exemplary structure after formation of an insulating spacer and a backside contact structure according to an embodiment of the present disclosure.

Referring to FIG. 12, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 13A:
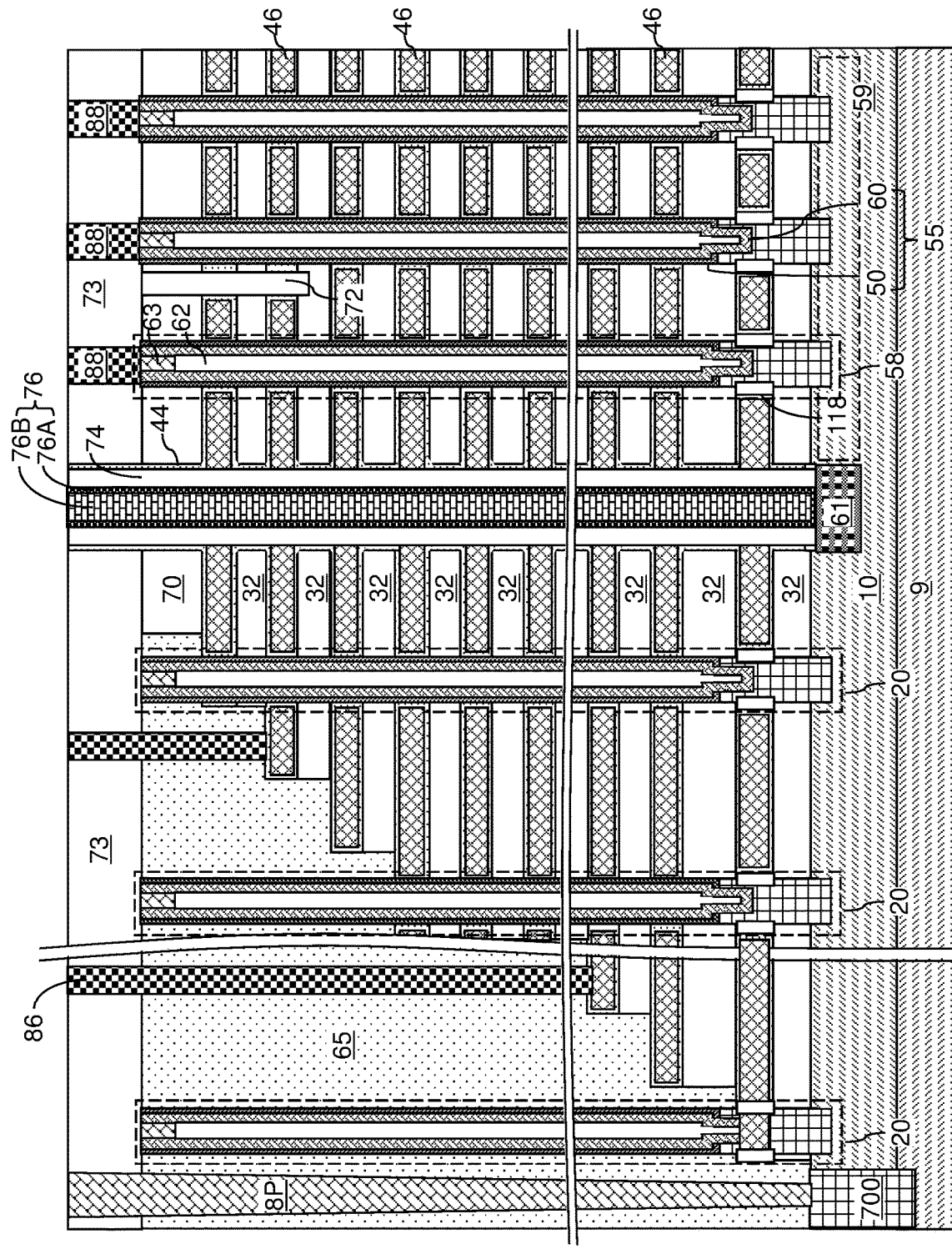
FIG. 13A is a schematic vertical cross-sectional view of the first exemplary structure after formation of additional contact via structures according to an embodiment of the present disclosure.
Figure 13B:
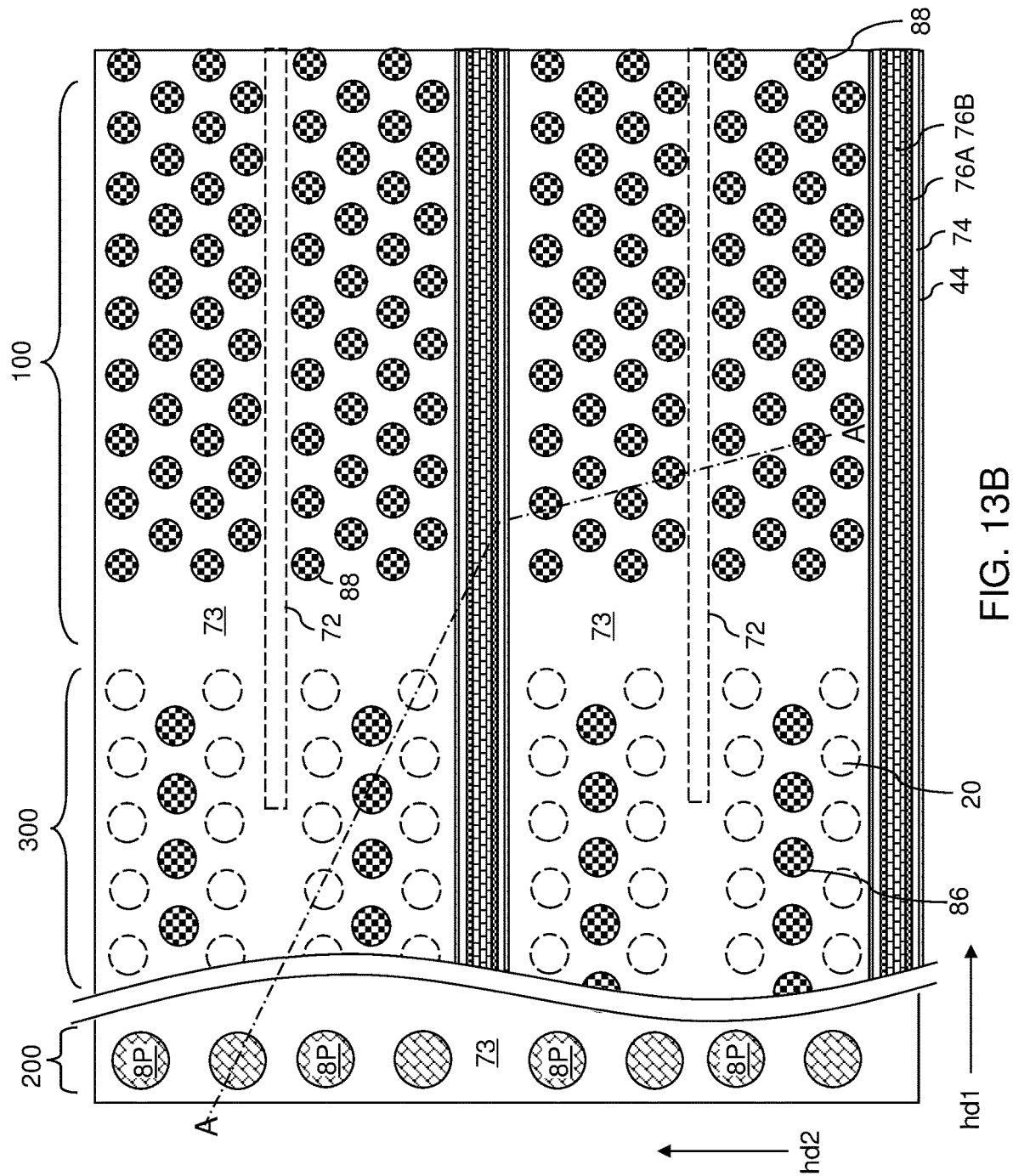
FIG. 13B is a top-down view of the first exemplary structure of FIG. 13A. The vertical plane A-A' is the plane of the schematic vertical cross-sectional view of FIG. 13A.
Figure 13C:
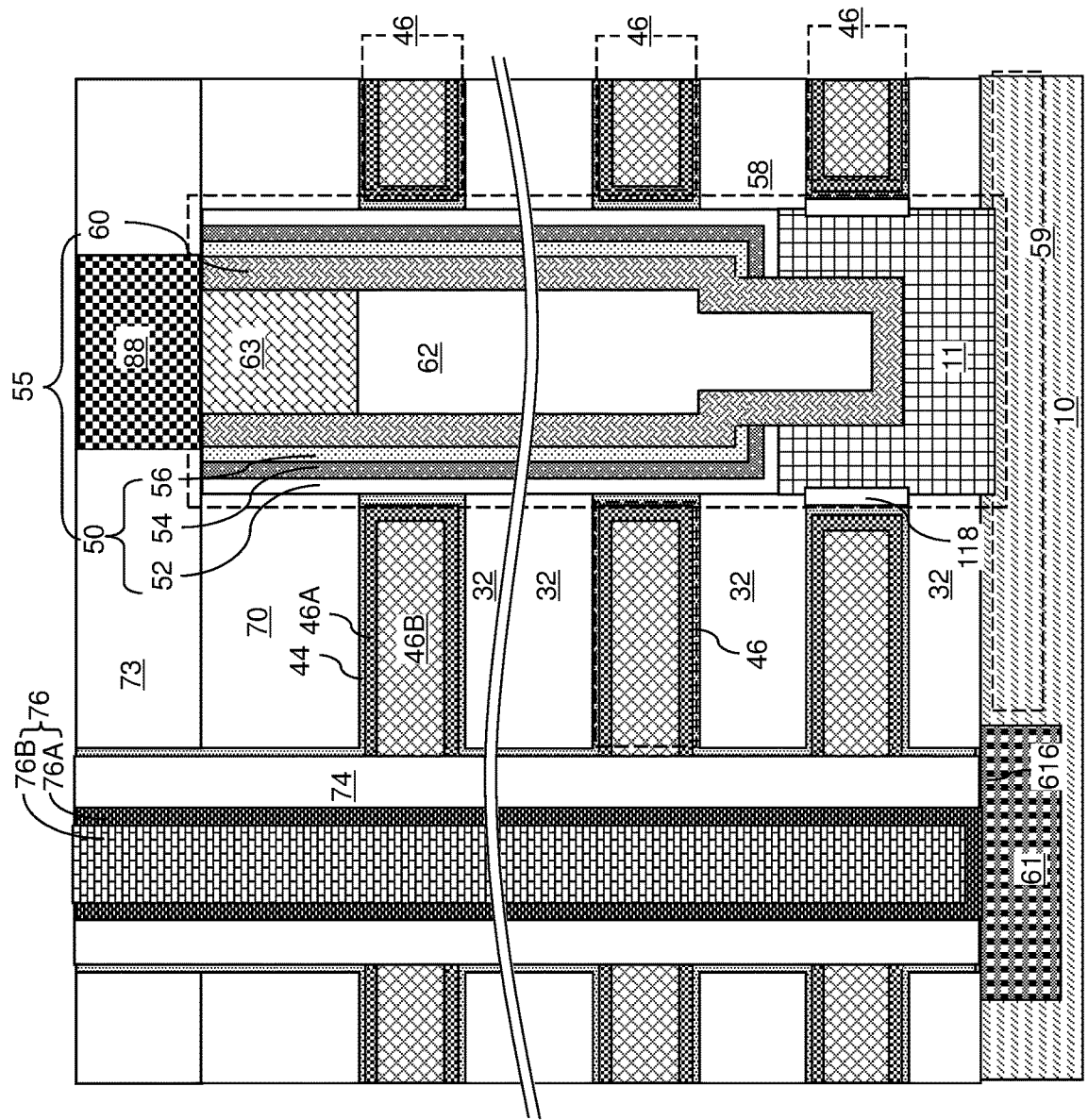
FIG. 13C is a magnified view of a region of the first exemplary structure of FIG.

Referring to FIGS. 13A-13C, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

In one embodiment, semiconductor devices formed over the substrate (9, 10) may comprise a three-dimensional memory array. The three-dimensional memory array may include an alternating stack of insulating layers 32 and electrically conductive layers 46 located over a substrate (9, 10); a two-dimensional array of memory openings 49 vertically extending through the alternating stack (32, 46); and a two-dimensional array of memory opening fill structures 58 located within the two-dimensional array of memory openings 49 and including a respective vertical semiconductor channel 60 and a respective vertical stack of memory elements (such as portions of the memory material layers 54 located at levels of the electrically conductive layers 46). The doped semiconductor material regions (such as the drain regions 63) are adjoined to a top end of a respective one of the vertical semiconductor channels 60. While the semiconductor device of the embodiment comprises a three-dimensional memory array, embodiments of the present disclosure can be practiced on any semiconductor structure including any suitable semiconductor device containing bit lines.

Figure 14:
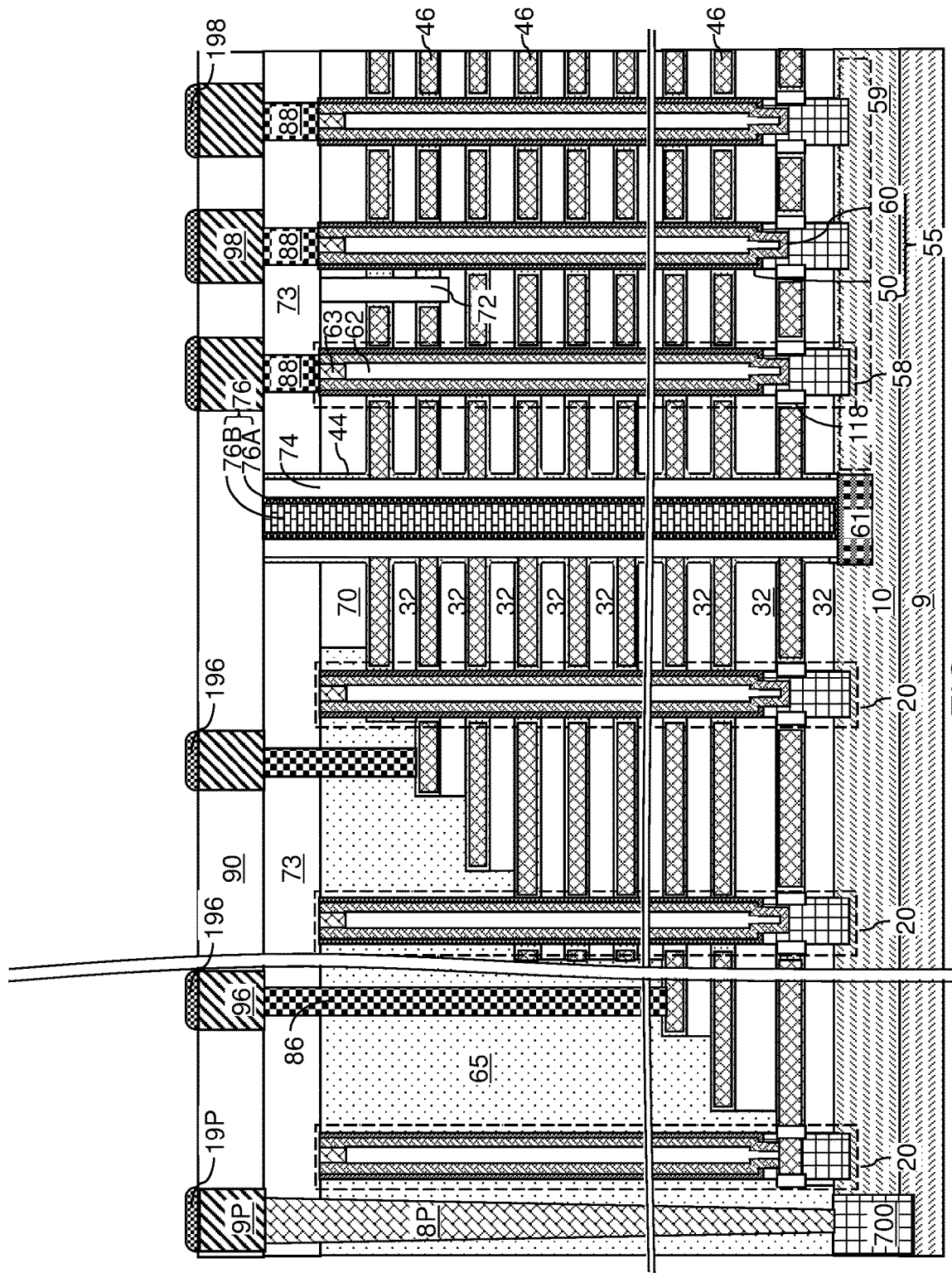
FIG. 14 is schematic vertical cross-sectional view of the first exemplary structure after formation of conductive cap plates according to an embodiment of the present disclosure.

Referring to FIG. 14, a connection-level dielectric layer 90 can be formed over the contact-level dielectric layer 73, or any underlying layer embedding contact via structures such as drain contact via structures 88 that contact the drain regions 63 (which are doped semiconductor regions). The connection-level dielectric layer 90 is a connection-level material layer comprised of at least one dielectric material. The connection-level dielectric layer 90 may include an interconnect-level dielectric material such as undoped silicate glass, a doped silicate glass, or organosilicate glass, or may include a sacrificial material (such as a semiconductor material or a carbon-based material) that is subsequently removed. The thickness of the connection-level dielectric layer 90 can be in a range from 100 nm to 1,000 nm, such as from 200 nm to 500 nm, although lesser and greater thicknesses may also be employed.

Connection via cavities can be formed through the connection-level dielectric layer 90 by depositing and lithographically patterning a photoresist layer over the connection-level dielectric layer 90, and transferring the pattern of openings in the photoresist layer through the connection-level dielectric layer 90 employing an anisotropic etch process. The photoresist layer can be subsequently removed, for example, by ashing.

At least one electrically conductive material can be deposited in the connection via cavities, and excess portions of the at least one electrically conductive material can be removed from above the horizontal plane including the top surface of the connection-level dielectric layer 90 by a planarization process, which may include a chemical mechanical planarization process and/or a recess etch process. Each remaining portion of the at least one electrically conductive material located within a respective one of the connection via cavities comprise connection-level via structures (98, 96, 9P). The connection-level via structures (98, 96, 9P) may comprise tungsten or copper. The connection-level via structures (98, 96, 9P) can comprise drain-side connection-level via structures 98 contacting a top surface of a respective one of the drain contact via structures 88, word-line-side connection-level via structures 96 contacting a top surface of a respective one of the word line contact via structures 86, source-side connection via structures (not illustrated) contacting the backside contact via structures 76, and peripheral-region connection via structures 9P contacting a top surface of a respective one of the peripheral device contact via structures 8P.

Generally, a combination of a connection-level material layer (such as the connection-level dielectric layer 90) and a two-dimensional array of connection via structures (such as the drain-side connection-level via structures 98) embedded in the connection-level material layer can be formed over the semiconductor device array. Each of the connection via structures within the two-dimensional array of connection via structures (such as the drain-side connection-level via structures 98) overlies, and is electrically connected to, a respective one of the doped semiconductor material regions (such as the drain regions 63). In one embodiment, the drain-side connection-level via structures 98 can be laterally elongated along a horizontal direction that is perpendicular to the lengthwise direction of the backside trenches 79. For example, the drain-side connection-level via structures 98 can be laterally elongated along the second horizontal direction (i.e., bit line direction) hd2, which is the lengthwise direction of bit lines to be subsequently formed.

Generally, a combination of a connection-level dielectric layer 90 and connection-level metal interconnect structures (98, 96, 9P) can be formed over semiconductor devices. A subset of the connection-level metal interconnect structures (98, 96) can be electrically connected to a node of one of the semiconductor devices, and can be embedded in the connection-level dielectric layer 90.

Optional conductive cap plates (198, 196, 19P) comprising an electrically conductive (e.g., metallic) material can be selectively grown on a top surface of the connection-level metal interconnect structures (98, 96, 9P) while suppressing growth of the conductive material from surfaces of the connection-level dielectric layer 90. For example, if the connection-level via structures (98, 96, 9P) may comprise copper, then the conductive cap plates (198, 196, 19P) may be used as a barrier to protect the connection-level via structures (98, 96, 9P) against fluorine or chlorine based attack during a subsequent gas phase tungsten deposition using a fluorine (e.g., tungsten hexafluoride) or chlorine (e.g., tungsten hexachloride) containing tungsten precursor gas. The conductive cap plates (198, 196, 19P) may also be formed on tungsten connection-level via structures (98, 96, 9P). Alternatively, the conductive cap plates (198, 196, 19P) may be omitted (e.g., in case the connection-level via structures (98, 96, 9P) comprise tungsten). The conductive cap plates (198, 196, 19P) can comprise drain-side conductive cap plates 198 contacting a top surface of a respective one of the drain-side connection-level via structures 98, word-line-side conductive cap plates 196 contacting a top surface of a respective one of the word-line-side connection-level via structures 96, and peripheral-region conductive cap plates 19P contacting a top surface of a respective one of the peripheral-region connection via structures 9P.

The conductive material of the conductive cap plates (198, 196, 19P) may comprise any suitable conductive material, such as Ru, Co, CoWB, CoWP, Ni, or NiAl alloy, which can protect the underlying connection-level via structures (98, 96, 9P) from a subsequent fluorine or chlorine attack. In one embodiment, the conductive material of the conductive cap plates (198, 196, 19P) can be selectively deposited by area selective deposition or selective plating on exposed surfaces of the connection-level via structures (98, 96, 9P) without depositing conductive cap plates (198, 196, 19P) on the surface of the connection-level dielectric layer 90. Thus, the deposition of the conductive material (which may be an elemental metal or metal allot) occurs only on physically exposed conductive surfaces, and does not proceed from dielectric surfaces such as the top surface of the connect-level dielectric layer 90. Alternatively, the conductive cap plates (198, 196, 19P) may comprise a diffusion barrier material, such as titanium, tantalum, titanium nitride or tantalum nitride. The diffusion barrier material may be deposited non-selectively as a blanket layer over the exposed upper surfaces of the connection-level via structures (98, 96, 9P) and the connection-level dielectric layer 90 followed by photolithography and etching of the blanket layer to form the conductive cap plates (198, 196, 19P).

In one embodiment, a top surface of a conductive cap plate (196, 198, 19P) may comprise a planar top surface segment located in a horizontal plane, and a peripheral convex surface segment that is adjoined to a periphery of the planar top surface segment and adjoined to a periphery of the bottom surface of the conductive cap plate (196, 198, 19P).

Figure 15A:
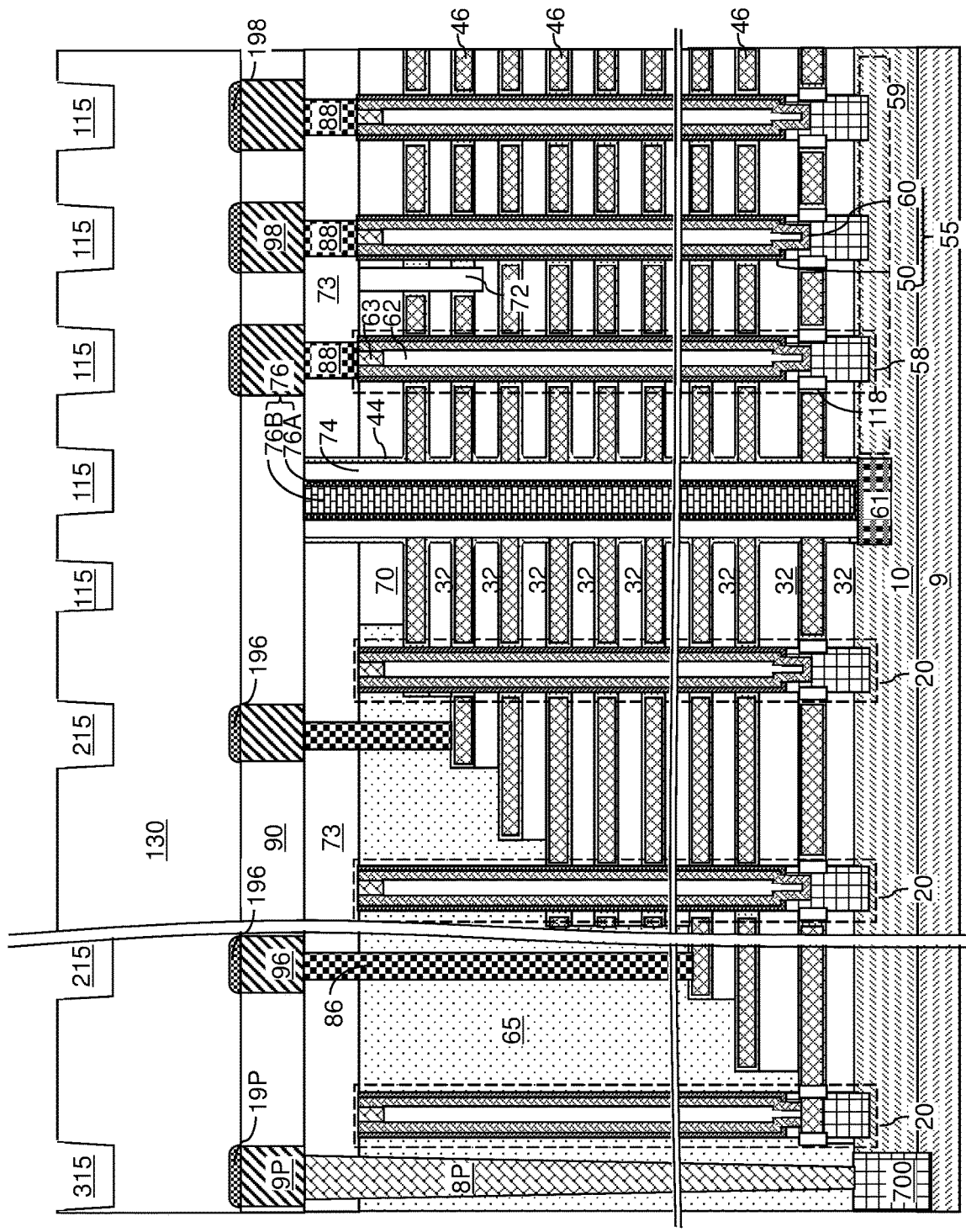
FIG. 15A is schematic vertical cross-sectional view of the first exemplary structure after formation of a line-and-via-level dielectric layer and line cavities according to an embodiment of the present disclosure.
Figure 15B:
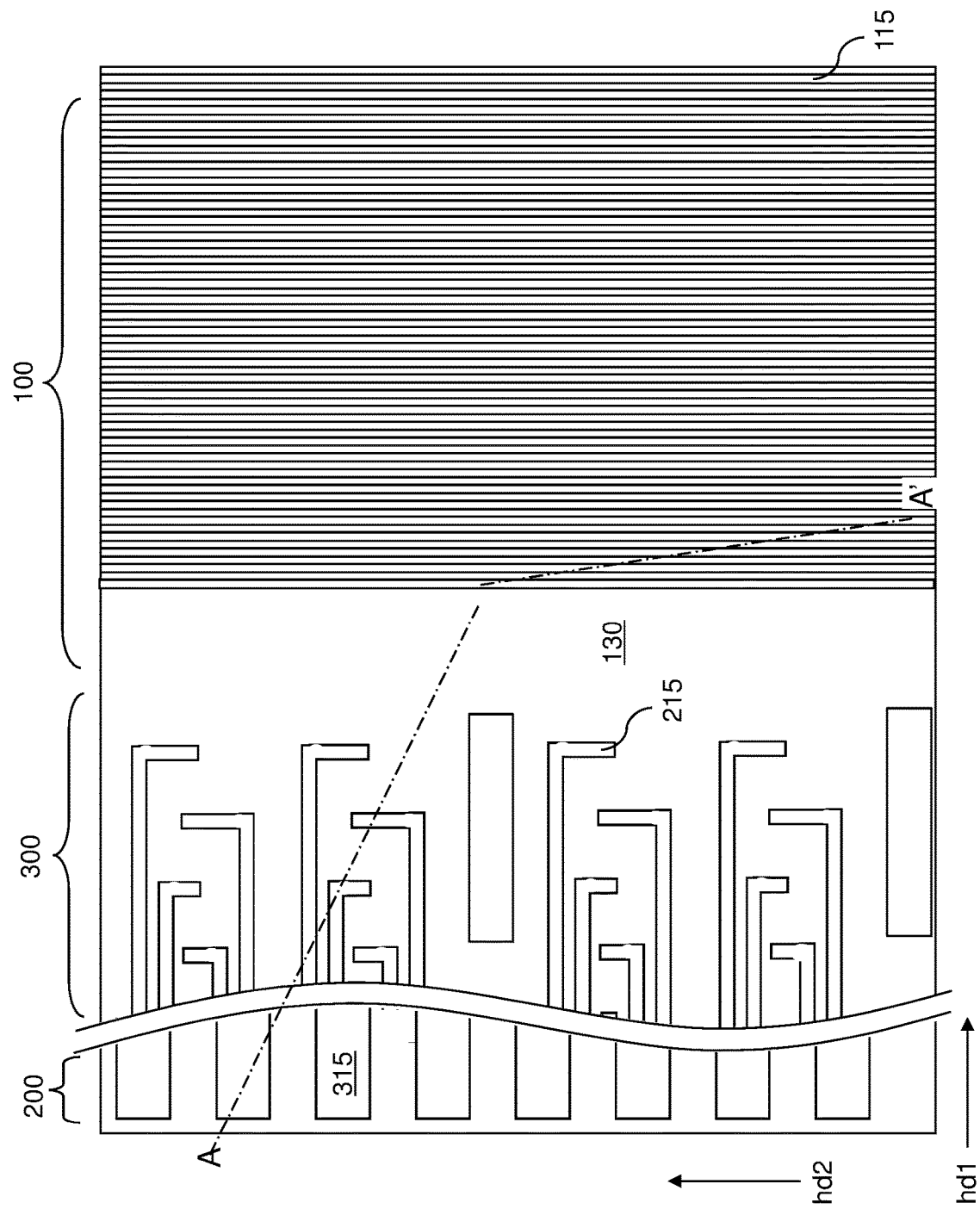
FIG. 15B is a top-down view of the first exemplary structure of FIG. 15A. The vertical plane A-A' is the plane of the schematic vertical cross-sectional view of FIG. 15A.

Referring to FIGS. 15A and 15B, a line-and-via-level dielectric layer 130 can be formed over the connect-level dielectric layer 90 and over the conductive cap plates (196, 198, 19P). The line-and-via-level dielectric layer 130 comprises an interconnect-level dielectric material that can be subsequently patterned to form line cavities and via cavities therein. The interconnect-level dielectric material may be undoped silicate glass (i.e., silicon oxide), a doped silicate glass, or organosilicate glass. The line-and-via-level dielectric layer 130 can be formed directly on top surfaces of the conductive cap plates (196, 198, 19P) by a conformal or non-conformal deposition process. For example, the line-and-via-level dielectric layer 130 may be formed by chemical vapor deposition or spin coating. The thickness of the line-and-via-level dielectric layer 130 may be in a range from 200 nm to 1,000 nm, such as from 400 nm to 700 nm, although lesser and greater thicknesses may also be employed.

A first photoresist layer (not shown) can be applied over the top surface of the line-and-via-level dielectric layer 130, and can be lithographically patterned to form openings having line patterns. A subset of the line patterns may have an areal overlap with a respective one of the conductive cap plates (196, 198, 19P). In one embodiment, a first subset of the line patterns may include bit line patterns, which are patterns of bit lines to be subsequently formed. The bit line patterns may include multiple line shapes that laterally extend along the second horizontal direction hd2 and laterally spaced apart along the first horizontal direction hd1 with a uniform pitch, which is herein referred to as a bit line pitch. Each line shape in the bit line pattern can have an areal overlap with a respective subset of the drain contact via structures 88 in a plan view such as a see-through top-down view.

In one embodiment, a second subset of the line patterns may include word-line-connection patterns, which are patterns of word-line-connection metal lines to be subsequently formed. The word-line-connection patterns may include line shapes having an areal overlap with a respective one of the word-line-side connection-level via structures 96 in the plan view. In one embodiment, a third subset of the line patterns may include peripheral connection patterns, which are patterns of peripheral metal lines to be subsequently formed. The peripheral connection pattern may include line shapes having an areal overlap with a respective one of the peripheral-region connection via structures 9P.

A first anisotropic etch process can be performed to etch upper portions of the line-and-via-level dielectric layer 130 that are not masked by the patterned first photoresist layer. Line cavities (115, 215, 315) are formed in the volumes from which the material of the line-and-via-level dielectric layer 130 is etched by the first anisotropic etch process. The line cavities (115, 215, 315) may comprise bit line cavities 115 overlying a respective subset of the drain-side conductive cap plates 198, word-line-connection line cavities 215 overlying a respective one of the word-line-side conductive cap plates 196, and peripheral line cavities 315 overlying a respective one of the peripheral-region conductive cap plates 19P. The line cavities (115, 215, 315) extend only through a portion of the thickness of the line-and-via-level dielectric layer 130, and do not extend to the conductive cap plates (196, 198, 19P) underlying the line-and-via-level dielectric layer 130. The patterned first photoresist layer can be subsequently removed, for example, by ashing.

Figure 16A:
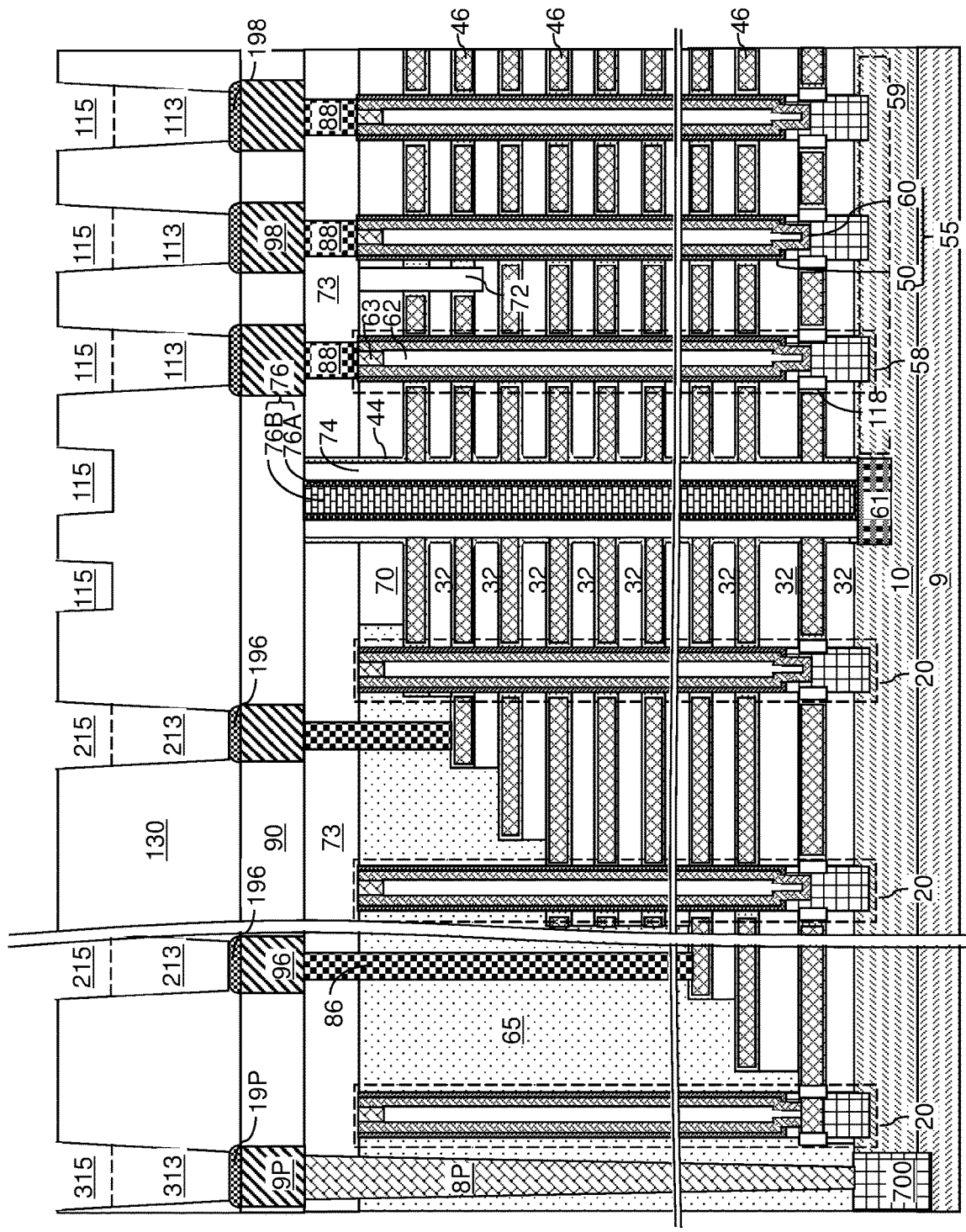
FIG. 16A is schematic vertical cross-sectional view of the first exemplary structure after formation of via cavities according to an embodiment of the present disclosure.
Figure 16B:
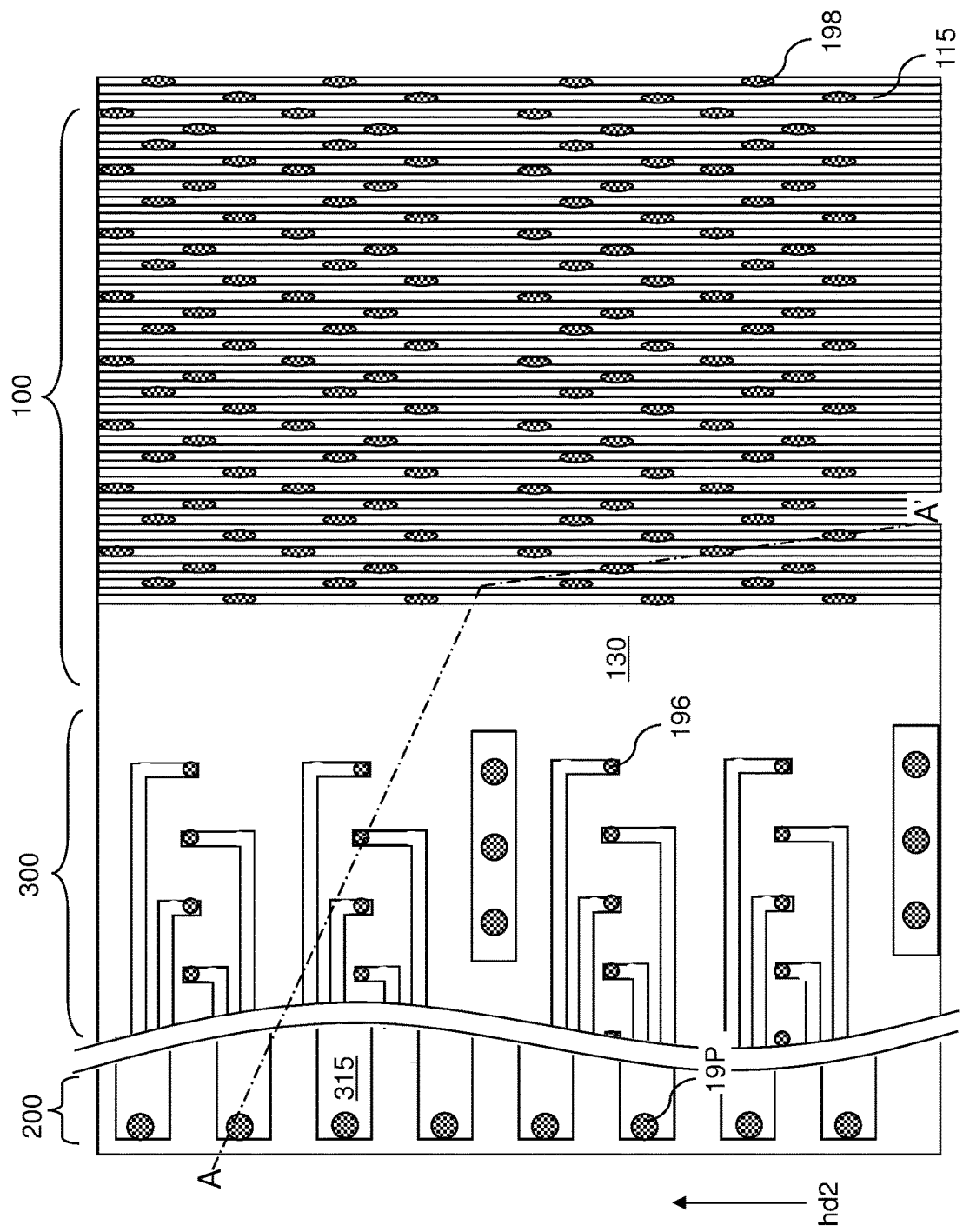
FIG. 16B is a top-down view of the first exemplary structure of FIG. 16A. The vertical plane A-A' is the plane of the schematic vertical cross-sectional view of FIG. 16A.

Referring to FIGS. 16A and 16B, a second photoresist layer (not shown) can be applied over the top surface of the line-and-via-level dielectric layer 130, and can be lithographically patterned to form discrete openings. The discrete openings may have an areal overlap with a respective one of the conductive cap plates (196, 198, 19P) if present, or with a respective one of the connection-level via structures (98, 96, 9P) if the conductive cap plates (196, 198, 19P) are omitted. In one embodiment, a first subset of the discrete openings may include bit-line-connection openings located within an area of a respective one of the bit line cavities 115. A second subset of the discrete openings may include word-line-connection openings located within an area of a respective one of the word-line-connection line cavities 215. A third subset of the discrete openings may include peripheral connection openings located within an area of a respective one of the peripheral line cavities 315.

A second anisotropic etch process can be performed to etch lower portions of the line-and-via-level dielectric layer 130 that are not masked by the patterned second photoresist layer. Via cavities (113, 213, 313) are formed in the volumes from which the material of the line-and-via-level dielectric layer 130 is etched by the second anisotropic etch process. The via cavities (113, 213, 313) may comprise bit-line-connection via cavities 113 that extend from a bottom surface of a respective bit line cavity 115 to a respective drain-side conductive cap plate 198, word-line-connection via cavities 213 that extends from a bottom surface of a respective word-line-connection line cavity 215 to a respective word-line-side conductive cap plate 196, and peripheral via cavities 313 that extends from a bottom surface of a peripheral line cavity 315 to a respective peripheral-region conductive cap plate 19P. The patterned second photoresist layer can be subsequently removed, for example, by ashing.

Each contiguous combination of a line cavity (115, 215, 315) and at least one via cavity (113, 213, 313) constitutes an integrated line and via cavity {(115, 113), (215, 213), (315, 313)} which extends through the entire thickness of the line-and-via-level dielectric layer 130. The integrated line and via cavities {(115, 113), (215, 213), (315, 313)} can include bit-line integrated line and via cavities (115, 113) including a respective bit line cavity 115 and a respective plurality of bit-line-connection via cavities 113, word-line-connection integrated line and via cavities (215, 213) including a respective word-line-connection line cavity 215 and at least one word-line-connection via cavity 213, and peripheral integrated line and via cavities (315, 314) including a respective peripheral line cavity 315 and at least one peripheral via cavity 313. Top surfaces of the conductive cap plates (198, 196, 19P) if present, or top surfaces of the connection-level via structures (98, 96, 9P) if the plates are omitted, are physically exposed at the bottom of the respective integrated line and via cavities {(115, 113), (215, 213), (315, 313)}.

Figure 17A:
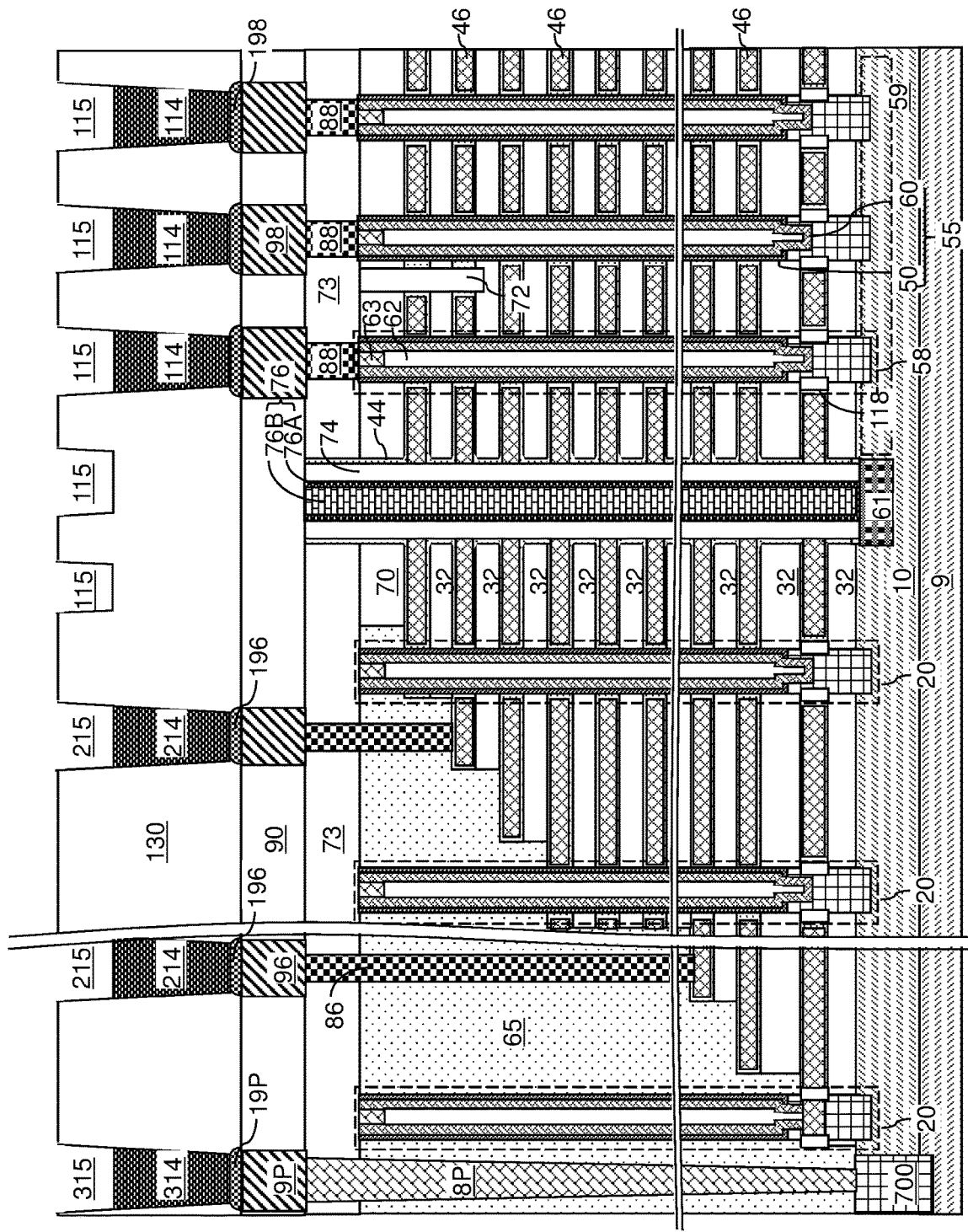
FIG. 17A is schematic vertical cross-sectional view of the first exemplary structure after formation of conductive via structures according to an embodiment of the present disclosure.
Figure 17B:
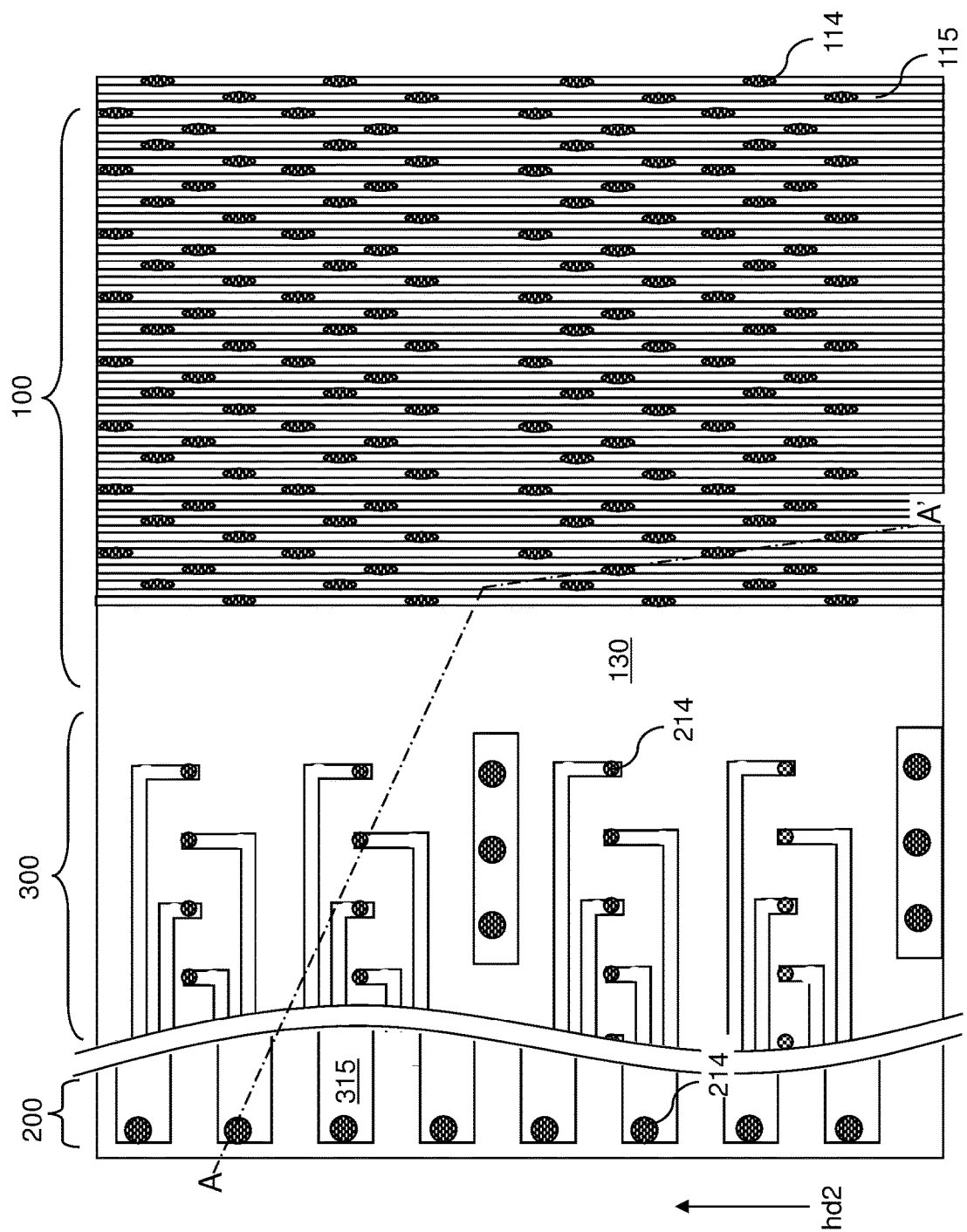
FIG. 17B is a top-down view of the first exemplary structure of FIG. 17A. The vertical plane A-A' is the plane of the schematic vertical cross-sectional view of FIG. 17A.

Referring to FIGS. 17A and 17B, a selective metal deposition process can be performed to grow a conductive via structure (114, 214, 314) from each physically exposed surface of the conductive cap plates (196, 198, 19P) if present, or top surfaces of the connection-level via structures (98, 96, 9P) if the plates are omitted. The selective metal deposition process may comprise an area selective deposition (ASD) process via CVD or ALD that employs a metal-containing precursor gas. During the selective metal deposition process, the metal-containing precursor gas decomposes on conductive surfaces to deposit a conductive material, while growth of the conductive material from dielectric surfaces such as the physically exposed surfaces of the line-and-via-level dielectric layer 130 including the surfaces of the bit line cavities 115 is suppressed.

The conductive via structures (114, 214, 314) can consist essentially of an elemental metal that is not copper. In one embodiment, the conductive material of the conductive via structure (114, 214, 314) may comprise, and/or may consist essentially of, tungsten that can be deposited by ASD using thermal decomposition or plasma decomposition of tungsten hexafluoride or tungsten hexachloride. During ASD, the deposition of the of tungsten occurs only on physically exposed conductive surfaces, and does not proceed from dielectric surfaces such as the surfaces of the line-and-via-level dielectric layer 130.

Generally, each conductive via structure (114, 214, 314) may be formed by selectively growing portions of an elemental metal from a physically exposed conductive surface located at a bottom of a via portion of an integrated line-and-via cavity {(115, 113), (215, 213), (315, 313)} while suppressing growth of the elemental metal from surfaces of the line-and-via-level dielectric layer 130. In one embodiment, the selective growth of the elemental metal can be continued until the top surfaces of the conductive via structures (114, 214, 314) are formed at, above, or below, the horizontal plane including the bottom surfaces of the line cavities (115, 215, 315). Thus, the conductive via structures (114, 214, 314) fill the respective via cavities (113, 213, 313) without filling the line cavities line cavities (115, 215, 315).

The conductive via structures (114, 214, 314) may include bit-line-connection via structures 114 formed within the bit-line-connection via cavities 113, word-line-connection via structures 214 formed in the word-line-connection via cavities 213, and peripheral via structures 314 formed in the peripheral via cavities 313. In one embodiment, each bit-line-connection via structure 114 can contact a top surface of a respective drain-side conductive cap plate 198, each word-line-connection via structure 214 can contact a top surface of a respective word-line-side conductive cap plate 196, and each peripheral via structure 314 can contact a top surface of a respective peripheral conductive cap plate 19P. In one embodiment, each conductive via structure (114, 214, 314) can include a straight or tapered cylindrical sidewall that contacts the line-and-vie-level dielectric layer 130.

Figure 18A:
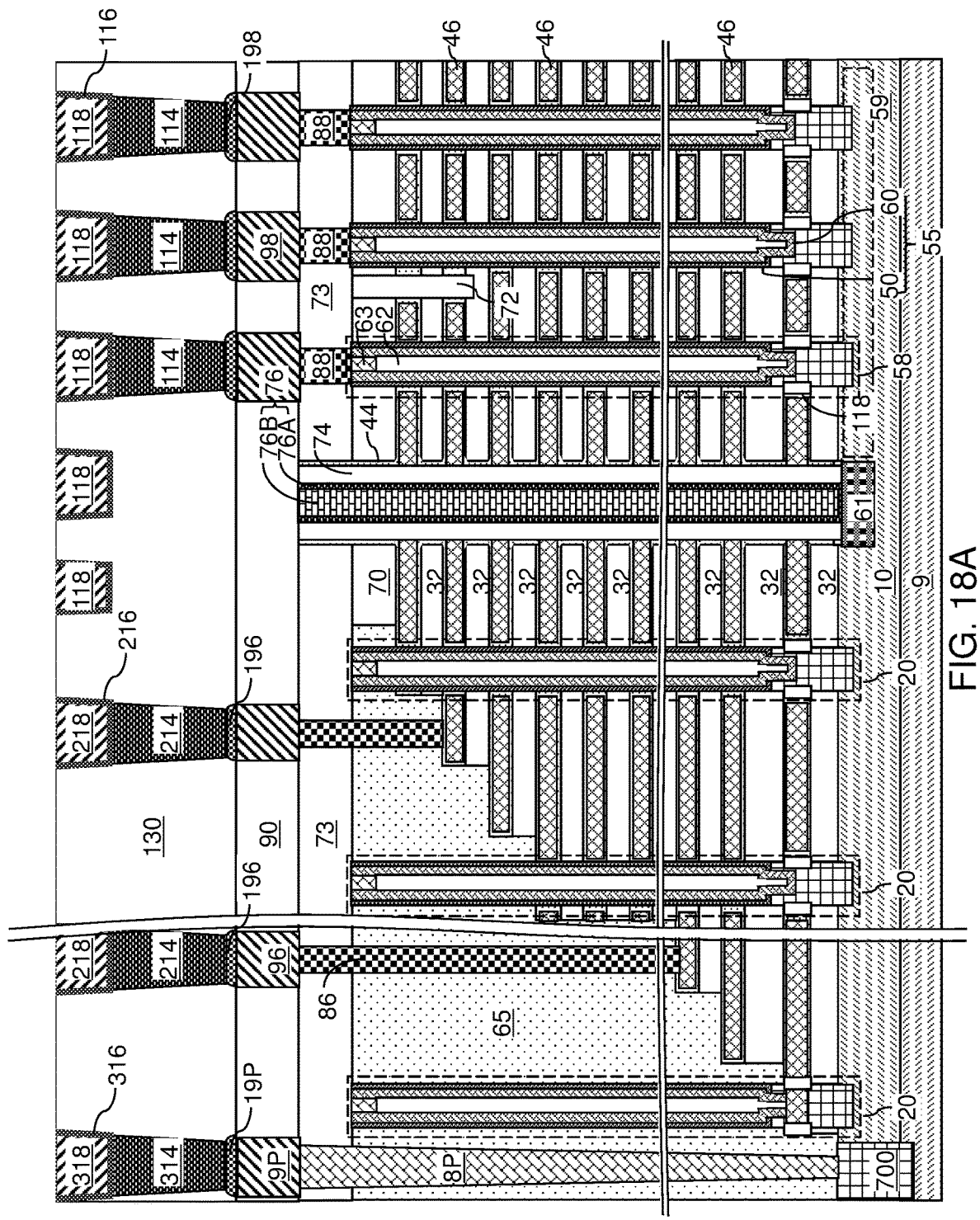
FIG. 18A is schematic vertical cross-sectional view of the first exemplary structure after formation of copper-based metal line structures according to an embodiment of the present disclosure.
Figure 18B:
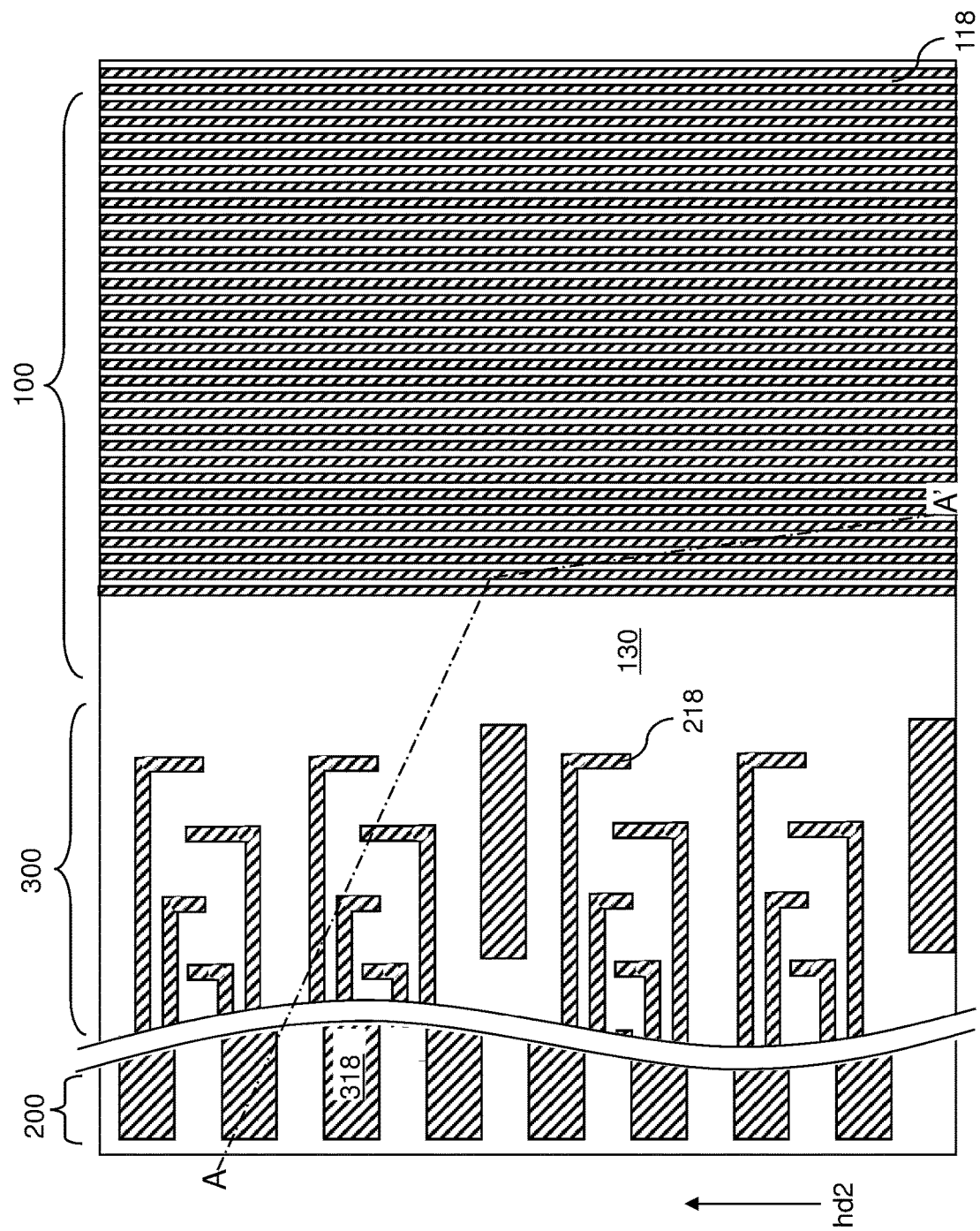
FIG. 18B is a top-down view of the first exemplary structure of FIG. 18A. The vertical plane A-A' is the plane of the schematic vertical cross-sectional view of FIG. 18A.

Referring to FIGS. 18A and 18B, an optional conductive liner layer can be conformally or non-conformally deposited on the physically exposed surfaces of the conductive via structures (114, 214, 314) and the line-and-via-level dielectric layers 130. The physically exposed surfaces of the line-and-via-level dielectric layers 130 include bottom surfaces and sidewalls of the line cavities (115, 215, 315), i.e., the line portions of the integrated line-and-via cavities {(115, 113), (215, 213), (315, 313)}. The conductive liner layer may include a conductive metallic compound material such as a conductive metallic nitride (such as WN, TiN, TaN, or MoN) or a conductive metallic carbide (such as WC, TiC, or TaC). The conductive liner layer may be deposited, for example, by physical vapor deposition. The thickness of each horizontally-extending portion of the conductive liner layer may be in a range from 3 nm to 30 nm, such as from 6 nm to 15 nm, although lesser and greater thicknesses may also be employed.

Generally, the conductive liner layer can be deposited on the conductive via structures and on each horizontal surface of the interconnect-level dielectric material located at a bottom of the line portion of each of the integrated line-and-via cavities {(115, 113), (215, 213), (315, 313)}. The conductive liner layer is subsequently divided into various conductive liners (116, 216, 316) (e.g., by CMP) and can include bit-line conductive liners 116, word-line-connection conductive liners 216, and peripheral conductive liners 316.

Subsequently, a copper-based conductive material can be deposited over the conductive liner layer If present), for example, by a physical vapor deposition and/or plating (e.g., electroplating). The copper-based conductive material comprises copper at an atomic percentage that is greater than 90%, which may be greater than 95%, such as 98% to 100% The copper-based conductive material may consist essentially of copper, or may include an alloying element such as aluminum or silicon at an atomic percentage that is less than 10%, which may be less than 5%, such as 0.1% to 2%. The thickness of the deposited copper-based conductive material can be selected such that the entirety of each volume of the integrated line-and-via cavities {(115, 113), (215, 213), (315, 313)} is filled with a respective combination of at least one conductive via structure (114, 214, 314), the conductive liner layer (if present), and the deposited copper-based conductive material. In other words, the copper-based conductive material fills the line cavities (115, 215, 315).

A planarization process such as a chemical mechanical polishing (CMP) process can be performed to remove portions of the conductive liner layer and the deposited copper-based conductive material that are located above the horizontal plane including the top surface of the line-and-via-level dielectric layer 130. Each remaining discrete portion of the deposited copper-based conductive material constitutes a copper-based conductive line structure (118, 218, 318). In one embodiment, each copper-based conductive line structure (118, 218, 318) comprises a top surface located within a horizontal plane including a top surface of the line-and-via-level dielectric layer 130. Each remaining discrete portion of the conductive liner layer constitutes a conductive liner (116, 216, 316). In one embodiment, each conductive liner (116, 216, 316) comprises a top surface located within a horizontal plane including the top surface of the line-and-via-level dielectric layer 130.

The copper-based conductive line structures (118, 218, 318) can include bit-line conductive line structures 118, word-line-connection conductive line structures 218, and peripheral conductive line structures 318. The conductive liners (116, 216, 316) can include bit-line conductive liners 116, word-line-connection conductive liners 216, and peripheral conductive liners 316. Each contiguous combination of a bit-line conductive liner 116 (if present) and a bit-line conductive line structure 118 constitutes a bit line (116, 118). Each contiguous combination of a word-line-connection conductive liner 116 and a word-line-connection conductive line structure 218 constitutes a word-line-connection line (216, 218). Each contiguous combination of a peripheral conductive liner 316 and a peripheral conductive line structure 318 constitutes a peripheral line (316, 318).

Generally, a copper-based conductive line structure (118, 218, 318) that comprises copper at an atomic percentage that is greater than 90% can be formed in a line portion of an integrated line-and-via cavity {(115, 113), (215, 213), or (315, 313)}. Interconnect line-and-via structures {(198, 114, 116, 118), (196, 214, 216, 218), (19P, 314, 316, 318)} are formed in the line-and-via-level dielectric layer 130.

Each of the interconnect line-and-via structures {(198, 114, 116, 118), (196, 214, 216, 218), (19P, 314, 316, 318)} may comprise a respective conductive via structure (198, 196, 19P), a respective copper-based conductive line structure (118, 218, 3148), an optional respective conductive liner (116, 216, 316) laterally surrounding the respective copper-based conductive line structure (118, 218, 318) and overlying the conductive via structure (114, 214, 314). In one embodiment, each conductive liner (116, 216, 316) comprises a first bottom surface segment that contacts a top surface of a respective conductive via structure (114, 214, 314), and a second bottom surface segment that contacts a respective recessed horizontal surface of the interconnect-level dielectric material of the line-and-via-level dielectric layer 130. Generally, the second bottom surface segment is located above, or below, a horizontal plane including the first bottom surface segment.

Generally, a conductive via structure (114, 214, 314) overlies and is electrically connected to a respective connection-level metal interconnect structure (98, 96, 9P), and may consist essentially of an elemental metal that is not copper, such as tungsten. In one embodiment, each copper-based conductive line structure (118, 218, 318) comprises copper at an atomic percentage that is greater than 90%, overlies a respective conductive via structure (114, 214, 314), and has a greater lateral extent than a respective underlying conductive via structure (114, 214, 314).

In one embodiment, each interconnect line-and-via structure {(198, 114, 116, 118), (196, 214, 216, 218), (19P, 314, 316, 318)} may comprise a respective conductive cap plate (198, 196, 19P) in contact with a top surface of a respective one of the connection-level metal interconnect structures (98, 96, 9P).

Figure 19A:
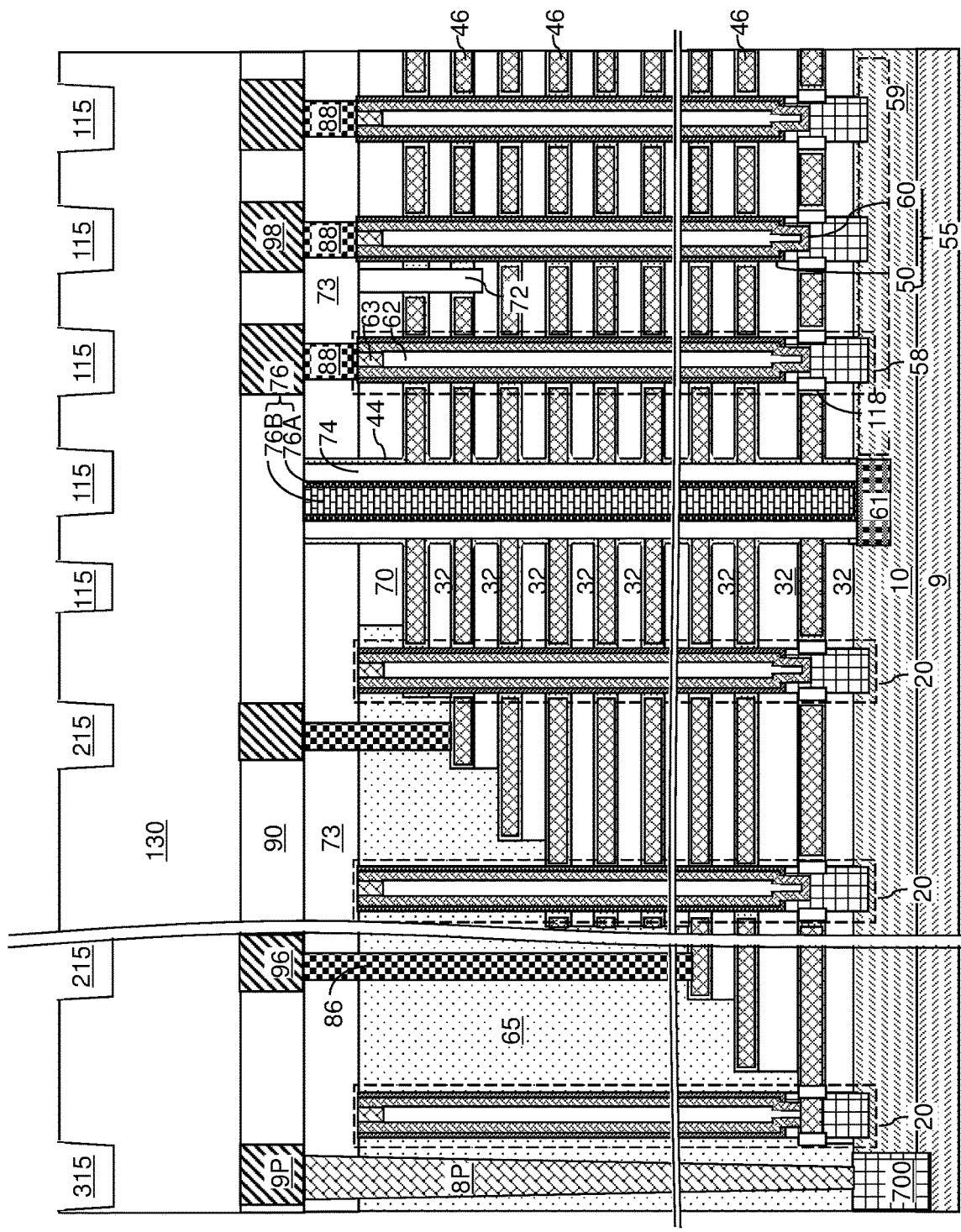
FIG. 19A is schematic vertical cross-sectional view of a second exemplary structure after formation of a line-and-via-level dielectric layer and line cavities according to an embodiment of the present disclosure.
Figure 19B:
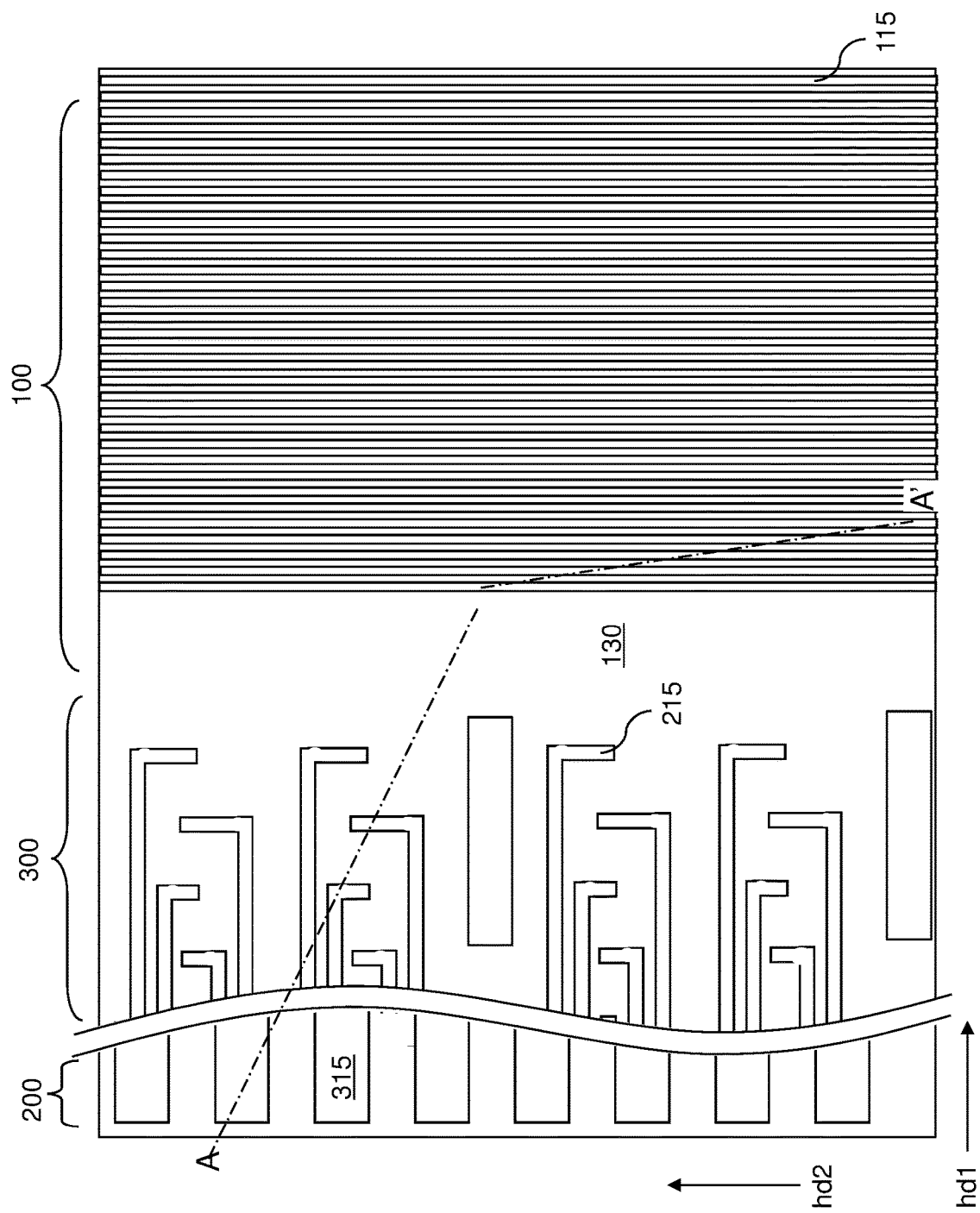
FIG. 19B is a top-down view of the second exemplary structure of FIG. 19A. The vertical plane A-A' is the plane of the schematic vertical cross-sectional view of FIG. 19A.

Referring to FIGS. 19A and 19B, a second exemplary structure according to an embodiment of the present disclosure can be derived from the first exemplary structure of FIGS. 14, 15A and 15B by omitting the processing steps for forming the conductive cap plates (198, 196, 19P) on FIG. 14. In other words, formation of the conductive cap plates (198, 196, 19P) is omitted during manufacture of the second exemplary structure, and the line-and-via-level dielectric layer 130 is deposited directly on the top surface of the connection-level dielectric layer 90 and the top surfaces of the connection-level via structures (98, 96, 9P). Subsequently, the line cavities (115, 215, 315) can be formed in an upper portion of the line-and-via-level dielectric layer 130 in the same manner as in the manufacture of the first exemplary structure of FIGS. 15A and 15B. Specifically, a first patterned photoresist layer and a first anisotropic etch process can be employed to form the line cavities (115, 215, 315).

Figure 20A:
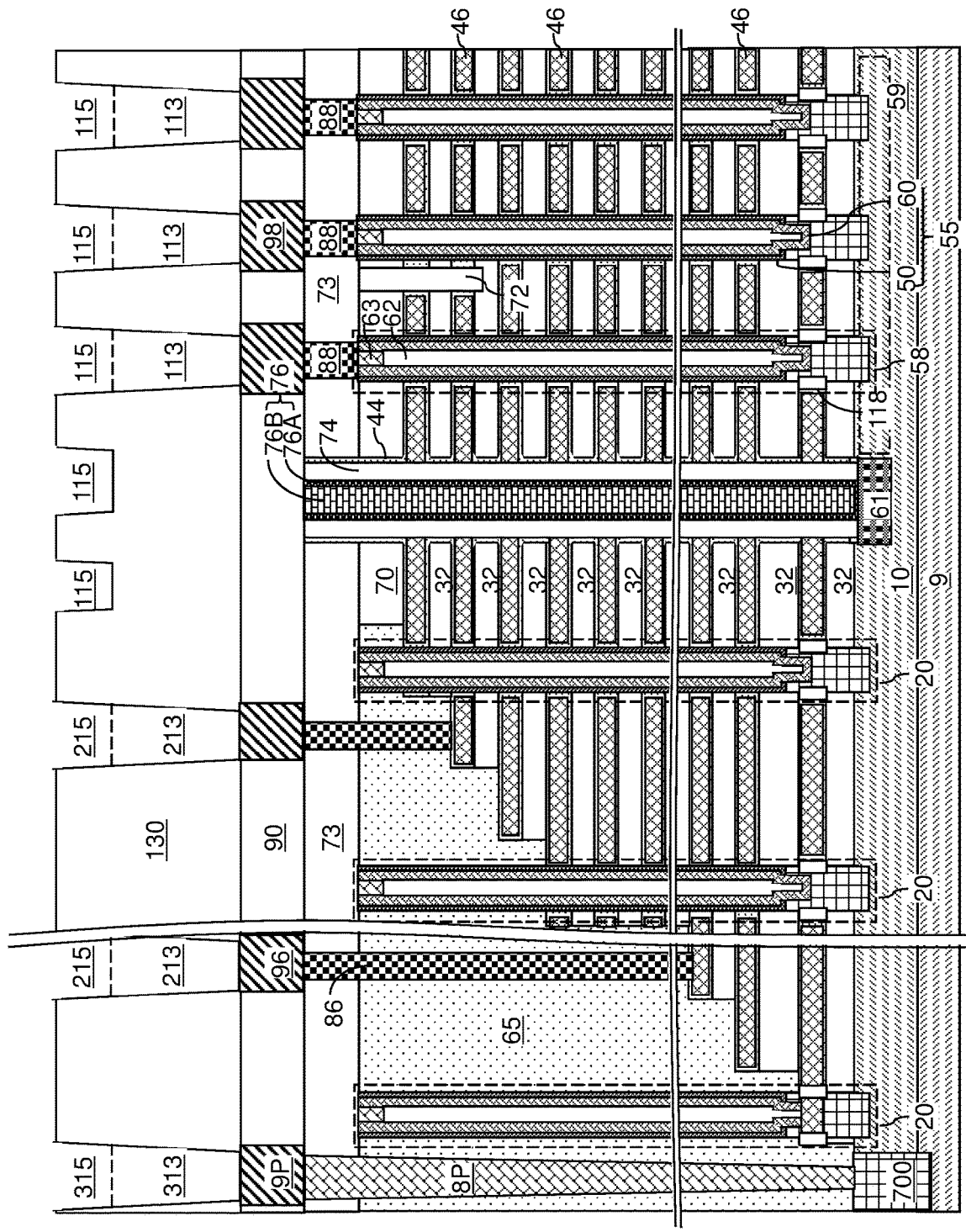
FIG. 20A is schematic vertical cross-sectional view of the second exemplary structure after formation of via cavities according to an embodiment of the present disclosure.
Figure 20B:
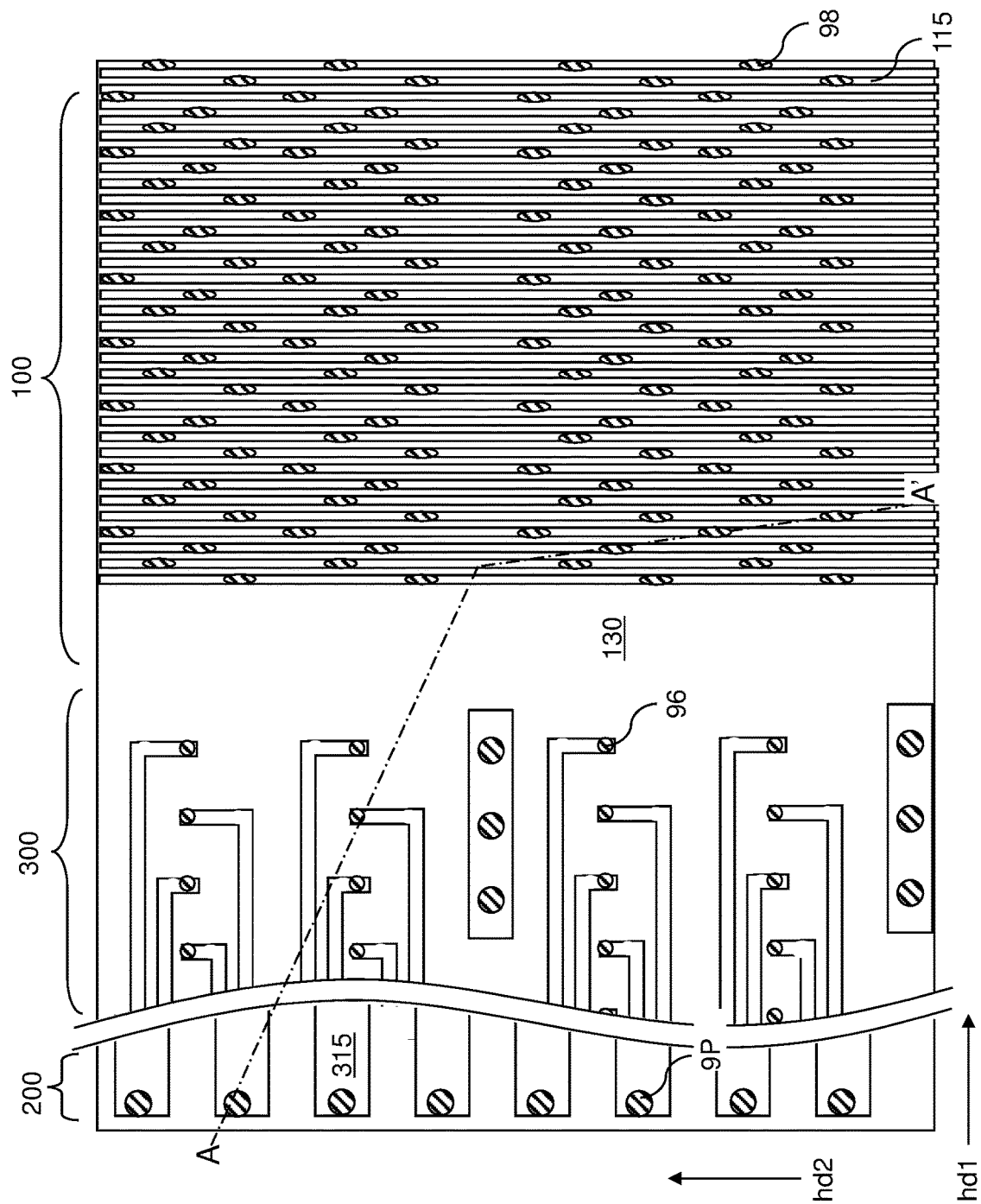
FIG. 20B is a top-down view of the second exemplary structure of FIG. 20A. The vertical plane A-A' is the plane of the schematic vertical cross-sectional view of FIG. 20A.

Referring to FIGS. 20A and 20B, a second photoresist layer (not shown) can be applied over the top surface of the line-and-via-level dielectric layer 130, and can be lithographically patterned to form discrete openings. The discrete openings may have an areal overlap with a respective one of the connection-level via structures (98, 96, 9P). In one embodiment, a first subset of the discrete openings may include bit-line-connection openings located within an area of a respective one of the bit line cavities 115. A second subset of the discrete openings may include word-line-connection openings located within an area of a respective one of the word-line-connection line cavities 215. A third subset of the discrete openings may include peripheral connection openings located within an area of a respective one of the peripheral line cavities 315.

A second anisotropic etch process can be performed to etch lower portions of the line-and-via-level dielectric layer 130 that are not masked by the patterned second photoresist layer. Via cavities (113, 213, 313) are formed in the volumes from which the material of the line-and-via-level dielectric layer 130 is etched by the second anisotropic etch process. The via cavities (113, 213, 313) may comprise bit-line-connection via cavities 113 that extend from a bottom surface of a respective bit line cavity 115 to a respective drain-side conductive cap plate 198, word-line-connection via cavities 213 that extend from a bottom surface of a respective word-line-connection line cavity 215 to a respective word-line-side conductive cap plate 196, and peripheral via cavities 313 that extend from a bottom surface of a peripheral line cavity 315 to a respective peripheral-region conductive cap plate 19P. The patterned second photoresist layer can be subsequently removed, for example, by ashing.

Each contiguous combination of a line cavity (115, 215, 315) and at least one via cavity (113, 213, 313) constitutes an integrated line and via cavity {(115, 113), (215, 213), (315, 313)}. The integrated line and via cavities {(115, 113), (215, 213), (315, 313)} can include bit-line integrated line and via cavities (115, 113) including a respective bit line cavity 115 and a respective plurality of bit-line-connection via cavities 113, word-line-connection integrated line and via cavities (215, 213) including a respective word-line-connection line cavity 215 and at least one word-line-connection via cavity 213, and peripheral integrated line and via cavities (315, 314) including a respective peripheral line cavity 315 and at least one peripheral via cavity 313. Top surfaces of the connection-level via structures (98, 96, 9P) are physically exposed at the bottom of the integrated line and via cavities {(115, 113), (215, 213), (315, 313)}.

Figure 21A:
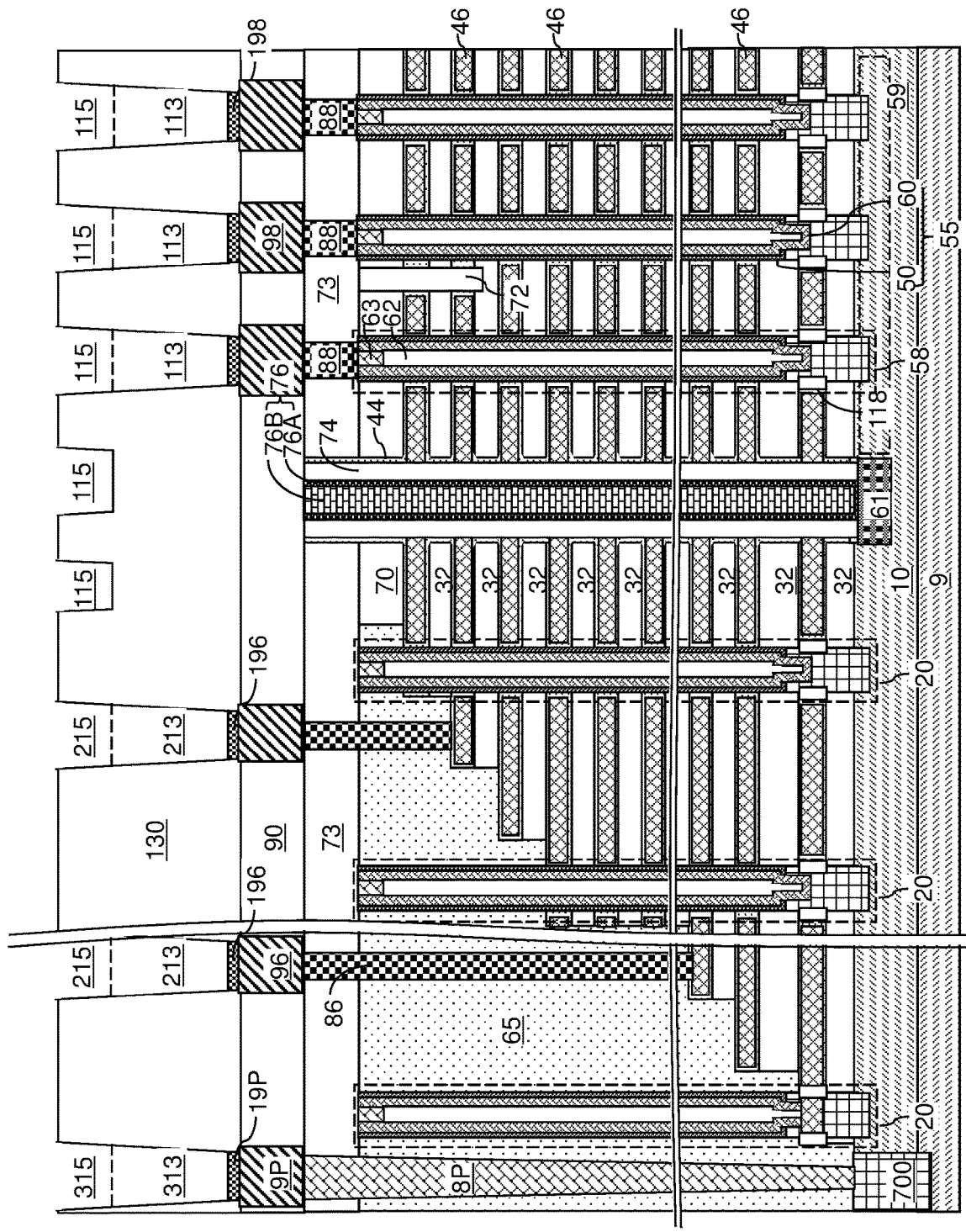
FIG. 21A is schematic vertical cross-sectional view of the second exemplary structure after formation of conductive cap plates according to an embodiment of the present disclosure.
Figure 21B:
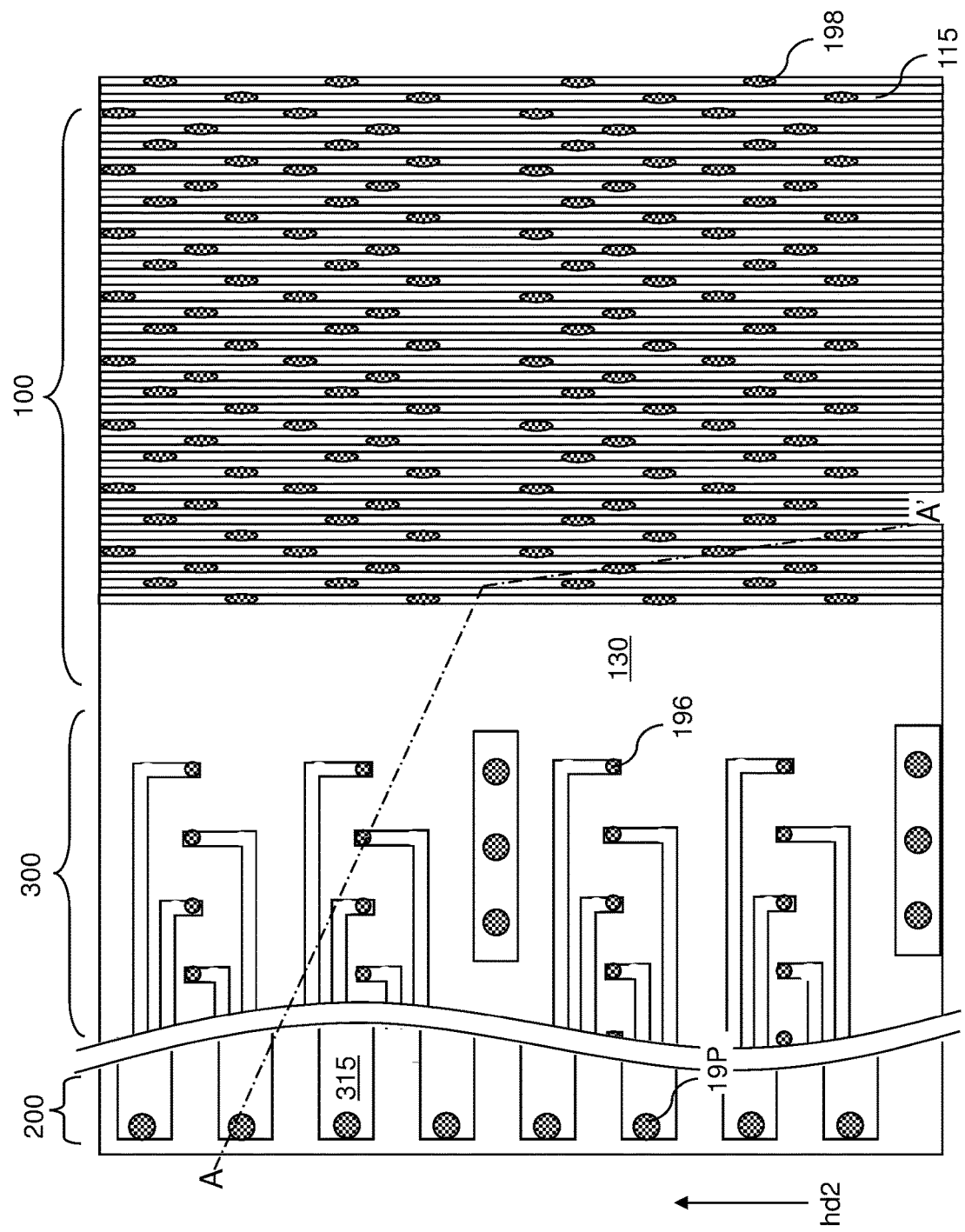
FIG. 21B is a top-down view of the second exemplary structure of FIG. 21A. The vertical plane A-A' is the plane of the schematic vertical cross-sectional view of FIG. 20A.

Referring to FIGS. 21A and 21B, the optional conductive cap plates (198, 196, 19P) comprising a conductive material can be selectively grown on a top surface of the connection-level metal interconnect structures (98, 96, 9P) at the bottom of the via portion of each of the integrated line and via cavities {(115, 113), (215, 213), (315, 313)} while suppressing growth of the conductive material from surfaces of the line-and-via-level dielectric layer 130. The conductive cap plates (198, 196, 19P) can comprise drain-side conductive cap plates 198 contacting a top surface of a respective one of the drain-side connection-level via structures 98, word-line-side conductive cap plates 196 contacting a top surface of a respective one of the word-line-side connection-level via structures 96, and peripheral-region conductive cap plates 19P contacting a top surface of a respective one of the peripheral-region connection via structures 9P.

Figure 22A:
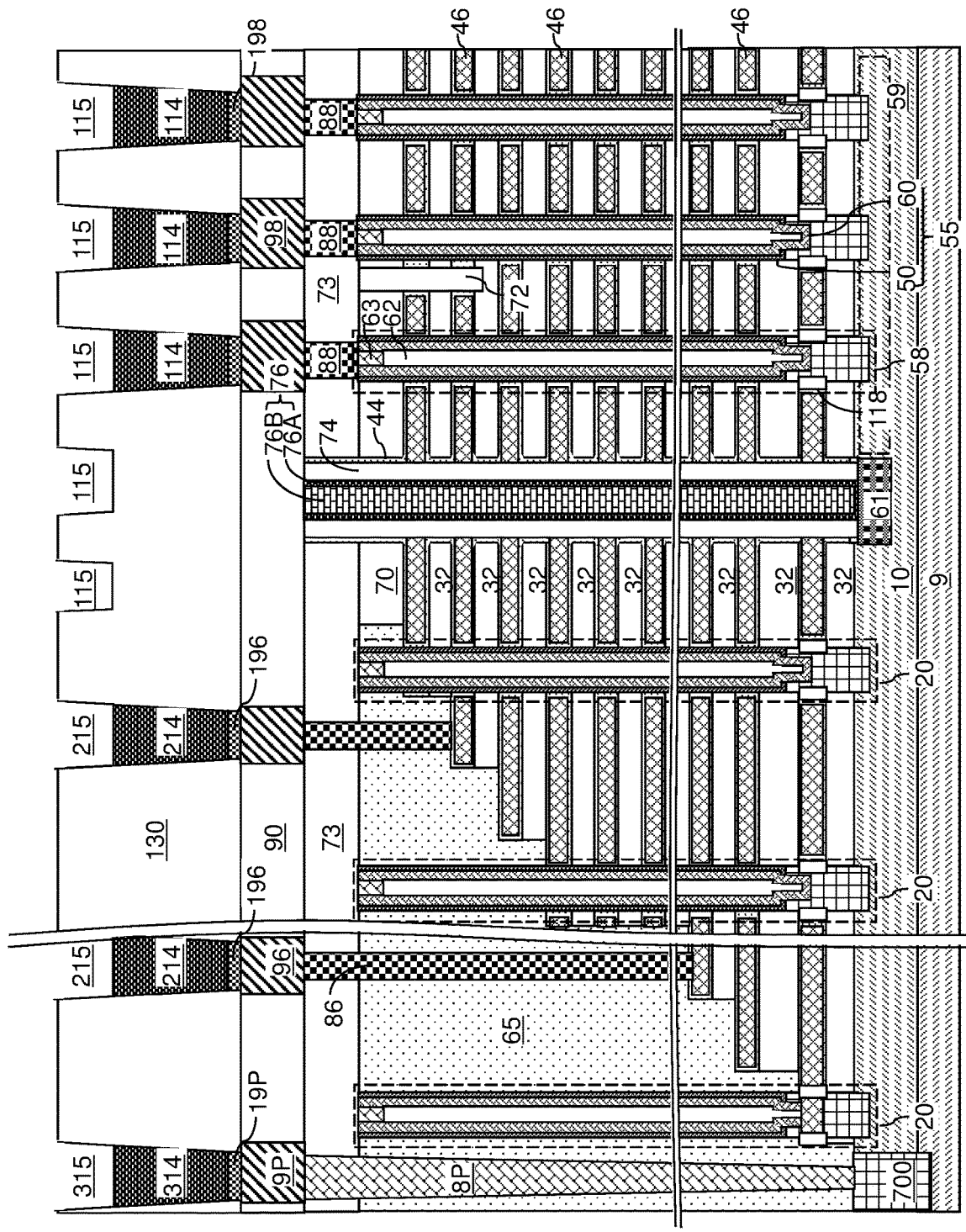
FIG. 22A is schematic vertical cross-sectional view of the second exemplary structure after formation of conductive via structures according to an embodiment of the present disclosure.
Figure 22B:
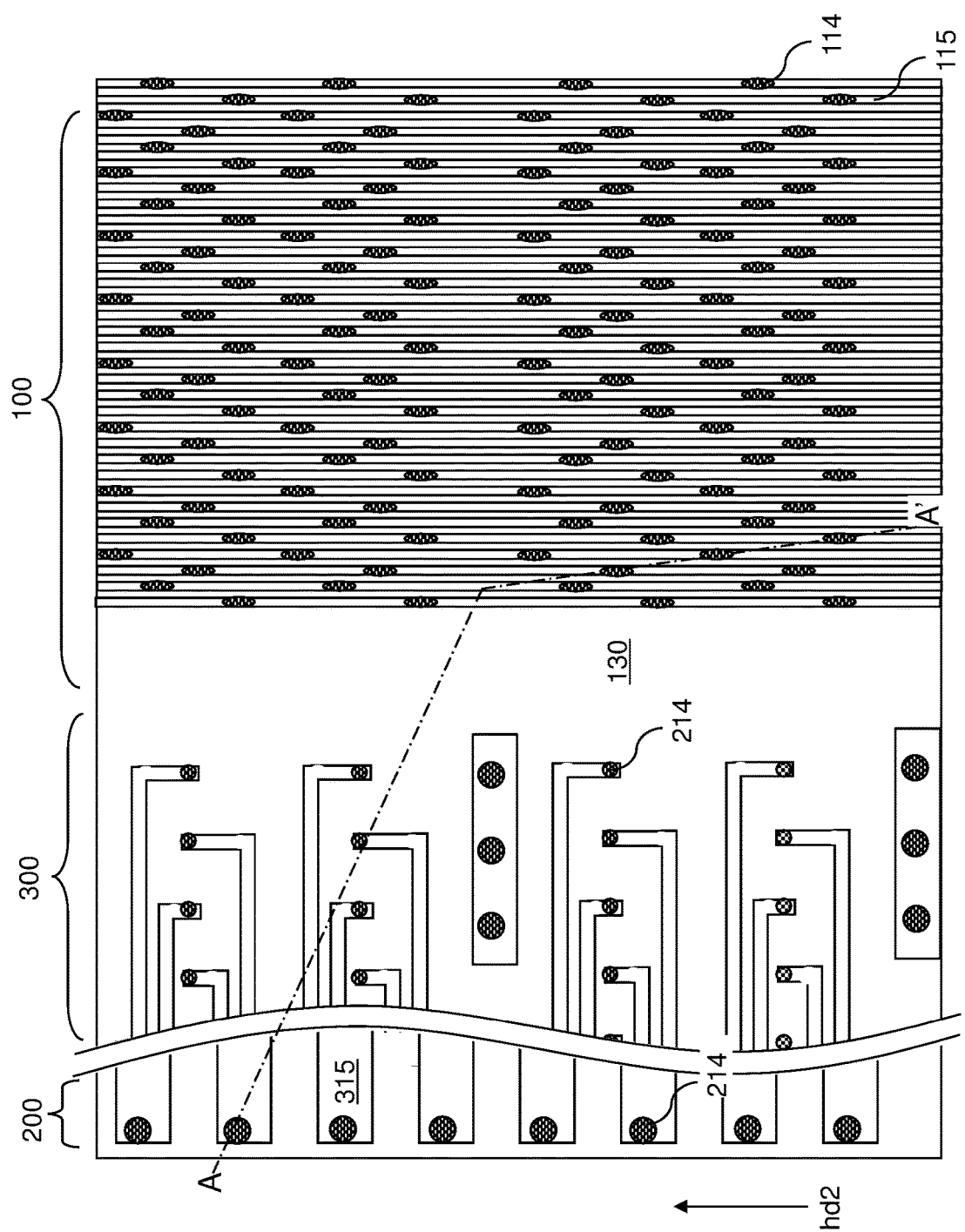
FIG. 22B is a top-down view of the second exemplary structure of FIG. 22A. The vertical plane A-A' is the plane of the schematic vertical cross-sectional view of FIG. 22A.

Referring to FIGS. 22A and 22B, a selective metal deposition process can be performed to grow a metallic via structure (114, 214, 314) from each physically exposed surface of the conductive cap plates (196, 198, 19P). The processing steps of FIGS. 17A and 17B can be employed to form the conductive via structures (114, 214, 314). Generally, each conductive via structure (114, 214, 314) may be formed by selectively growing portions of an elemental metal from a physically exposed conductive surface located at a bottom of a via portion of an integrated line-and-via cavity {(115, 113), (215, 213), (315, 313)} while suppressing growth of the elemental metal from surfaces of the line-and-via-level dielectric layer 130. In one embodiment, the selective growth of the elemental metal can be continued until the top surfaces of the conductive via structures (114, 214, 314) are formed at, above, or below, the horizontal plane including the bottom surfaces of the line cavities (115, 215, 315).

The conductive via structures (114, 214, 314) may include bit-line-connection via structures 114 formed within the bit-line-connection via cavities 113, word-line-connection via structures 214 formed in the word-line-connection via cavities 213, and peripheral via structures formed in the peripheral via cavities 313. In one embodiment, each bit-line-connection via structure 114 can contact a top surface of a respective drain-side conductive cap plate 198, each word-line-connection via structure 214 can contact a top surface of a respective word-line-side conductive cap plate 196, and each peripheral via structure 314 can contact a top surface of a respective peripheral conductive cap plate 19P. In one embodiment, each conductive via structure (114, 214, 314) can include a straight or tapered cylindrical sidewall that contacts the line-and-vie-level dielectric layer 130. In one embodiment, the periphery of the planar top surface of each conductive cap plate (198, 196, 19P) coincides with a periphery of a bottom surface of an overlying conductive via structure (114, 214, 314).

Figure 23A:
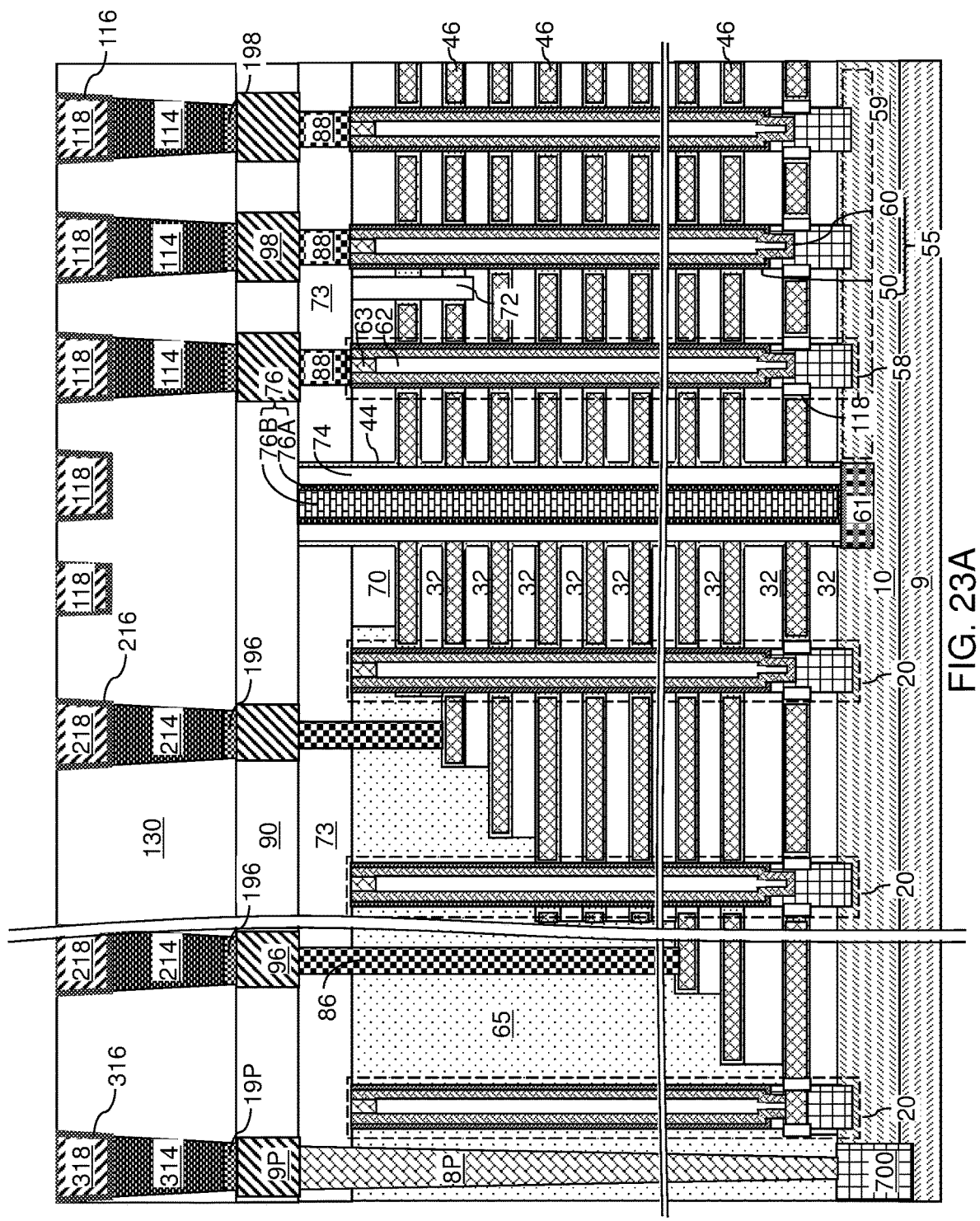
FIG. 23A is schematic vertical cross-sectional view of the second exemplary structure after formation of copper-based metal line structures according to an embodiment of the present disclosure.
Figure 23B:
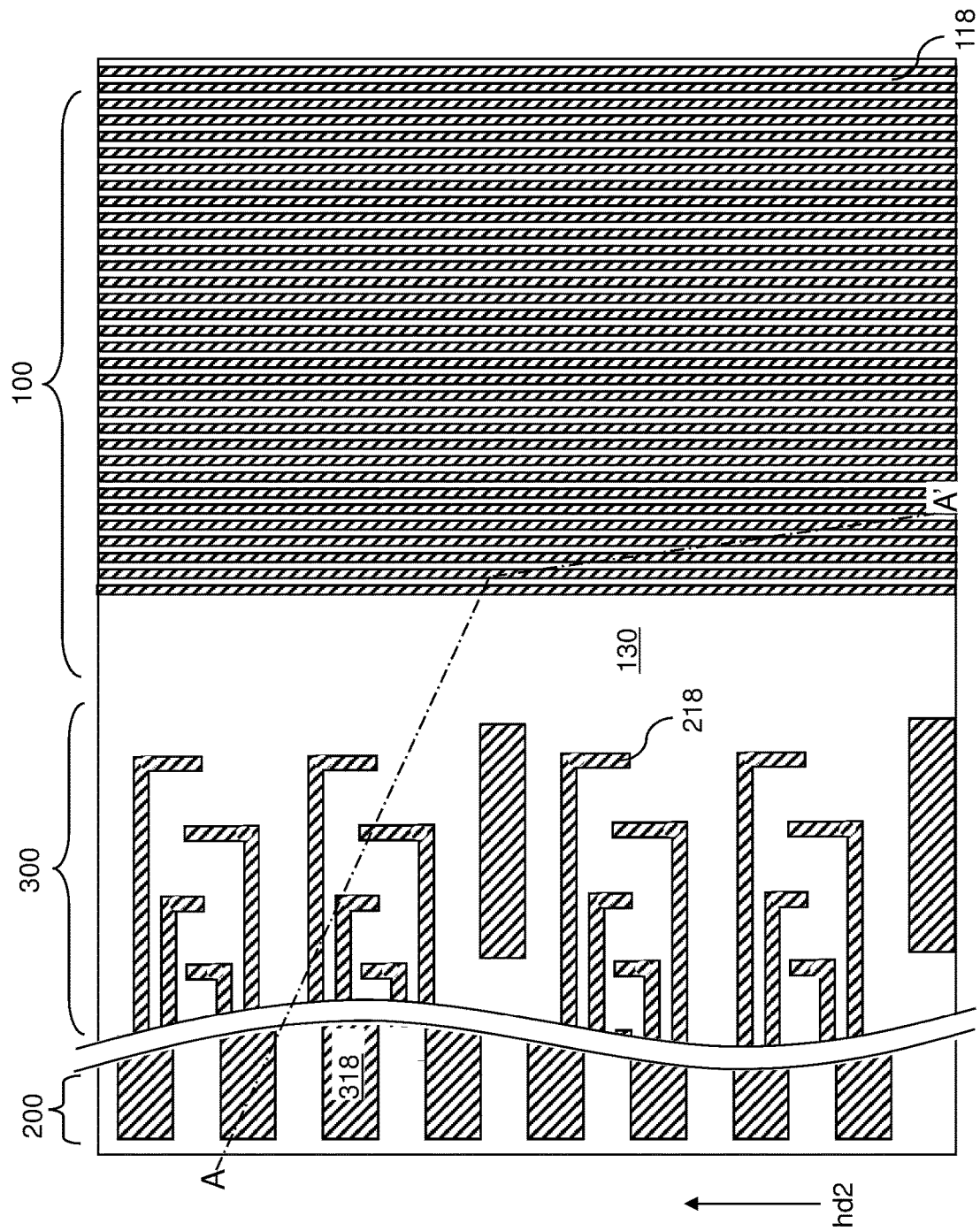
FIG. 23B is a top-down view of the second exemplary structure of FIG. 23A. The vertical plane A-A' is the plane of the schematic vertical cross-sectional view of FIG. 23A.

Referring to FIGS. 23A and 23B, the processing steps of FIGS. 18A and 18B can be performed to form the optional conductive liners (116, 216, 316) and the copper-based conductive line structures (118, 218, 318). The conductive liners (116, 216, 316) can include bit-line conductive liners 116, word-line-connection conductive liners 216, and peripheral conductive liners 316. The copper-based conductive line structures (118, 218, 318) can include bit-line conductive line structures 118, word-line-connection conductive line structures 218, and peripheral conductive line structures 318. Each contiguous combination of a bit-line conductive liner 116 and a bit-line conductive line structure 118 constitutes a bit line (116, 118). Each contiguous combination of a word-line-connection conductive liner 116 and a word-line-connection conductive line structure 218 constitutes a word-line-connection line (216, 218). Each contiguous combination of a peripheral conductive liner 316 and a peripheral conductive line structure 318 constitutes a peripheral line (316, 318).

Generally, a copper-based conductive line structure (118, 218, 318) that comprises copper at an atomic percentage that is greater than 90% can be formed in a line portion of an integrated line-and-via cavity {(115, 113), (215, 213), or (315, 313)}. Interconnect line-and-via structures {(198, 114, 116, 118), (196, 214, 216, 218), (19P, 314, 316, 318)} are formed in the line-and-via-level dielectric layer 130.

Each of the interconnect line-and-via structures {(198, 114, 116, 118), (196, 214, 216, 218), (19P, 314, 316, 318)} may comprise a respective conductive via structure (198, 196, 19P), a respective copper-based conductive line structure (118, 218, 318), a respective conductive liner (116, 216, 316) laterally surrounding the respective copper-based conductive line structure (118, 218, 318) and overlying the conductive via structure (114, 214, 314). In one embodiment, each conductive liner (116, 216, 316) comprises a first bottom surface segment that contacts a top surface of a respective conductive via structure (114, 214, 314), and a second bottom surface segment that contacts a respective recessed horizontal surface of the interconnect-level dielectric material of the line-and-via-level dielectric layer 130. Generally, the second bottom surface segment is located above, or below, a horizontal plane including the first bottom surface segment.

Generally, a conductive via structure (114, 214, 314) overlies, and is electrically connected to, a respective connection-level metal interconnect structure (98, 96, 9P), and may consist essentially of an elemental metal that is not copper. In one embodiment, each copper-based conductive line structure (118, 218, 318) comprises copper at an atomic percentage that is greater than 90%, overlies a respective conductive via structure (114, 214, 314), and has a greater lateral extent than a respective underlying conductive via structure (114, 214, 314).

In one embodiment, each interconnect line-and-via structure {(198, 114, 116, 118), (196, 214, 216, 218), (19P, 314, 316, 318)} may comprise a respective conductive cap plate (198, 196, 19P) in contact with a top surface of a respective one of the connection-level metal interconnect structures (98, 96, 9P).

Figure 24:
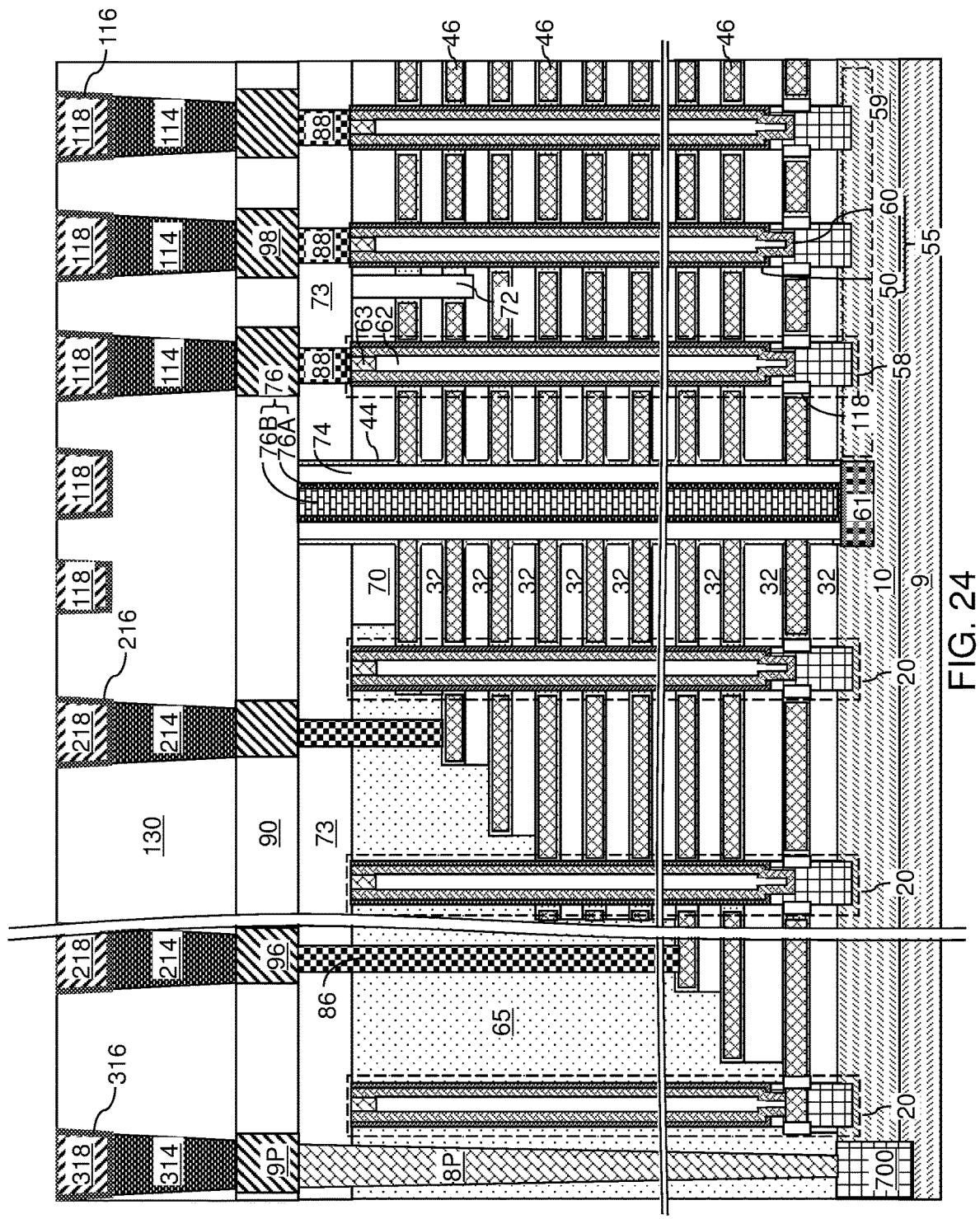
FIG. 24 is schematic vertical cross-sectional view of a third exemplary structure after formation of copper-based metal line structures according to an embodiment of the present disclosure.

Referring to FIG. 24, a third exemplary structure according to an embodiment of the present disclosure can be derived from the first exemplary structure or the second exemplary structure by omitting formation of the conductive cap plates (198, 196, 19P). Thus, each of the a conductive via structures (114, 214, 314) can be formed directly on a top surface of a respective one of the connection-level via structures (98, 96, 9P).

The various embodiments of the present disclosure provide integrated line-and-via structures {(198, 114, 116, 118), (196, 214, 216, 218), (19P, 314, 316, 318)} including a respective conductive via structure (114, 214, 314). The conductive via structures (114, 214, 314) are formed by a selective metal deposition process that grows a conductive material from bottom to top within via cavities. As such, the conductive via structures (114, 214, 314) can be formed with a high aspect ratio, and the integrated line-and-via structures {(198, 114, 116, 118), (196, 214, 216, 218), (19P, 314, 316, 318)} can be formed with a high density with few or no voids. Thus, a method of forming high density metal lines, such as bit lines (116, 118) can be formed with less steps (e.g., a single damascene rather than dual damascene process), and the reliability and device density of semiconductor devices, such as three-dimensional memory devices, can be increased.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists o" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
   forming a semiconductor device over a substrate;
   forming a combination of a connection-level dielectric layer and a connection-level metal interconnect structure over the semiconductor device, wherein the connection-level metal interconnect structure is electrically connected to a node of the semiconductor device and is embedded in the connection-level dielectric layer;
   forming a conductive cap plate by performing an area selective deposition or a selective plating process that deposits a conductive material from a top surface of the connection-level metal interconnect structure without growing the conductive material from surface of the connection-level dielectric layer;
   forming a line-and-via-level dielectric layer over the connection-level dielectric layer and directly on an entirety of a top surface of the conductive cap plate;
   forming an integrated line-and-via cavity through the line-and-via-level dielectric layer over the connection-level metal interconnect structure;
   selectively growing a conductive via structure consisting essentially of an elemental metal that is not copper from the top surface of the conductive cap plate without filling a line portion of the integrated line-and-via cavity and without filling an upper region of the via cavity portion such that a top surface; and
   forming a copper-based conductive line structure that comprises copper at an atomic percentage that is greater than 90% in the line portion of the integrated line-and-via cavity.

2. The method of claim 1, wherein an interconnect line-and-via structure comprising the conductive via structure and the copper-based conductive line structure is formed in the integrated line-and-via cavity.

3. The method of claim 1, further comprising forming a conductive liner on the conductive via structure and on sidewalls of the line portion of the integrated line-and-via cavity, wherein the copper-based conductive line structure is formed directly on the conductive liner.

4. The method of claim 1, wherein the conductive via structure is formed by selectively growing tungsten by area selective deposition from the top surface of the conductive cap plate while suppressing growth of the elemental metal from surfaces of the line-and-via-level dielectric layer.

5. The method of claim 1, wherein the conductive cap plate comprises Ru, Co, CoWB, CoWP, Ni, or NiAl alloy.

6. The method of claim 1, wherein the semiconductor device comprises a three dimensional memory device comprising:
   an alternating stack of insulating layers and electrically conductive layers; and
   a memory opening fill structure extending through the alternating stack and comprising a vertical semiconductor channel, a memory film surrounding the vertical semiconductor channel, and a drain region contacting a top end of the vertical semiconductor channel.

7. The method of claim 6, wherein the copper-based conductive line comprises a copper bit line which is electrically connected to the drain region of the three dimensional memory device.

8. The method of claim 1, wherein a contact area between the conductive via structure and the conductive cap plate has a lesser lateral extent than a bottom surface of the conductive cap plate.

9. The method of claim 1, wherein:
a bottom surface of the conductive cap plate is formed entirely within a horizontal plane including the top surface of the connection-level metal interconnect structure; and
the line-and-via-level dielectric layer is formed directly on a top surface of the connection-level dielectric layer.

10. The method of claim 1, wherein a center portion of a top surface of the conductive cap plate is physically exposed underneath a via cavity portion of the integrated line-and-via cavity while a peripheral portion of the top surface of the conductive cap plate is in direct contact with a remaining portion of the line-and-via-level dielectric layer after the step of forming the integrated line-and-via cavity.

11. The method of claim 1, wherein the top surface of the conductive cap plate comprises a planar top surface segment and a peripheral convex surface segment that is adjoined to a periphery of the planar top surface segment and adjoined to a periphery of a bottom surface of the conductive cap plate.

12. A semiconductor structure, comprising:
a semiconductor device located over a substrate;
a connection-level metal interconnect structure electrically connected to a node of the semiconductor device and embedded in a connection-level dielectric layer;
a conductive cap plate that contacts a top surface of the connection-level metal interconnect structure, wherein a top surface of the conductive cap plate comprises a planar top surface segment and a peripheral convex surface segment that is adjoined to a periphery of the planar top surface segment and adjoined to a periphery of a bottom surface of the conductive cap plate; and
an interconnect line-and-via structure embedded in a line-and-via-level dielectric layer that overlies the connection-level dielectric layer comprising an interconnect-level dielectric material, wherein the interconnect line-and-via structure comprises:
a conductive via structure that overlies and is electrically connected to the connection-level metal interconnect structure and consists essentially of an elemental metal that is not copper; and
a copper-based conductive line structure that comprises copper at an atomic percentage that is greater than 90%, overlies the conductive via structure, and has a greater lateral extent than the conductive via structure,
and wherein:
the conductive via structure contacts the planar top surface segment of the conductive cap plate; and
a concave surface segment of the interconnect-level dielectric material of the line-and-via-level dielectric layer is in direct contact with the peripheral convex surface segment of the conductive cap plate.

13. The semiconductor structure of claim 12, wherein the interconnect line-and-via structure further comprises a conductive liner laterally surrounding the copper-based conductive line structure and overlying the conductive via structure.

14. The semiconductor structure of claim 13, wherein the conductive liner comprises:
a top surface located within a horizontal plane including a top surface of the line-and-via-level dielectric layer; and
a first bottom surface that contacts a top surface of the conductive via structure.

15. The semiconductor structure of claim 12, wherein the conductive via structure consists essentially of tungsten.

16. The semiconductor structure of claim 12, wherein the conductive plate comprises Ru, Co, CoWB, CoWP, Ni, or NiAl alloy.

17. The semiconductor structure of claim 12, wherein the semiconductor device comprises a three dimensional memory device comprising:
an alternating stack of insulating layers and electrically conductive layers; and
a memory opening fill structure extending through the alternating stack and comprising a vertical semiconductor channel, a memory film surrounding the vertical semiconductor channel, and a drain region contacting a top end of the vertical semiconductor channel.

18. The method of claim 17, wherein the copper-based conductive line comprises a copper bit line which is electrically connected to the drain region of the three dimensional memory device.

19. The semiconductor structure of claim 12, wherein the interconnect-level dielectric material contacts top surface of the connection-level dielectric layer and all sidewalls of the interconnect line-and-via structure.

* * * * *